United States Patent
Ito et al.

(10) Patent No.: US 7,368,939 B2
(45) Date of Patent: May 6, 2008

(54) DATA INPUT/OUTPUT CIRCUIT INCLUDED IN SEMICONDUCTOR MEMORY DEVICE

(75) Inventors: Mikihiko Ito, Tokyo (JP); Katsuki Matsudera, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 86 days.

(21) Appl. No.: 11/391,371

(22) Filed: Mar. 29, 2006

(65) Prior Publication Data

US 2006/0226871 A1 Oct. 12, 2006

(30) Foreign Application Priority Data

Mar. 30, 2005 (JP) .............................. 2005-097936

(51) Int. Cl.
*G06F 7/38* (2006.01)
*H03K 19/173* (2006.01)

(52) U.S. Cl. .................... 326/38; 710/51; 327/151; 365/233

(58) Field of Classification Search ................ 365/222, 365/233, 221; 327/151–157; 326/38
See application file for complete search history.

(56) References Cited

U.S. PATENT DOCUMENTS

| | | | |
|---|---|---|---|
| 6,275,444 B1 | 8/2001 | Nakano et al. | 365/233 |
| 6,376,307 B1 * | 4/2002 | Kim | 438/257 |
| 6,463,006 B2 | 10/2002 | Nakano et al. | 365/233 |
| 6,510,095 B1 * | 1/2003 | Matsuzaki et al. | 365/222 |
| 6,898,139 B2 * | 5/2005 | Lee et al. | 365/221 |

\* cited by examiner

*Primary Examiner*—James Cho
*Assistant Examiner*—Crystal L Hammond
(74) *Attorney, Agent, or Firm*—Oblon, Spivak, McClelland, Maier & Neustadt, P.C.

(57) ABSTRACT

A control circuit receives an external control signal in synchronism with an internal clock and generates an address signal and internal control signals. A data multiplexer has a plurality of input parallel lines and a plurality of output parallel lines and is switched to one of a first output state and a second output state in accordance with the internal control signal. In the first state, the data multiplexer outputs parallel data, which is input to the plurality of input parallel lines and read out from the memory core unit, to the plurality of output parallel lines corresponding to the plurality of input parallel lines. In the second state, the data multiplexer selects 1-bit data of the parallel data input to the plurality of input parallel lines and outputs the 1-bit data to the plurality of output parallel lines. A conversion circuit converts the parallel data into serial data.

11 Claims, 30 Drawing Sheets

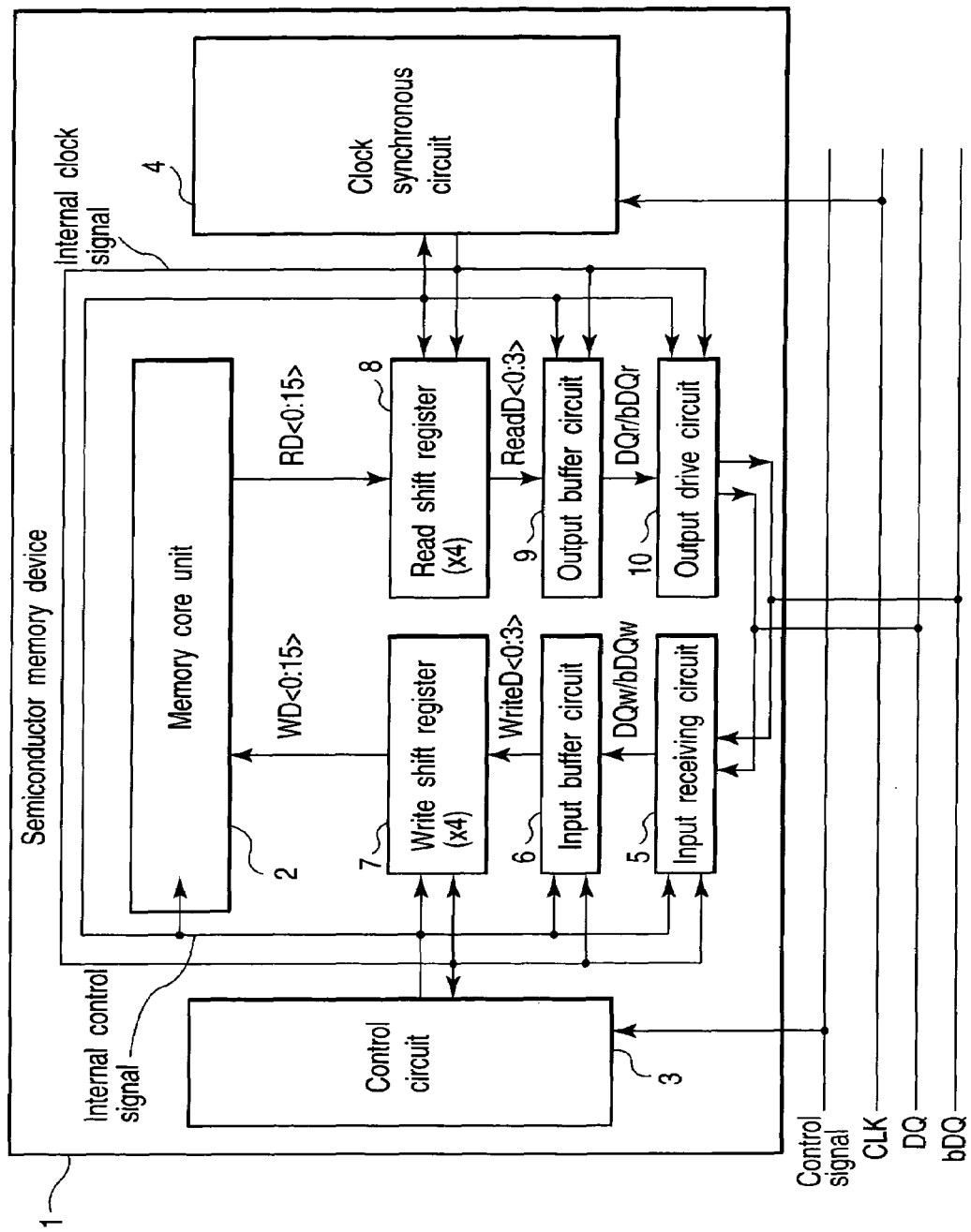
F I G. 2

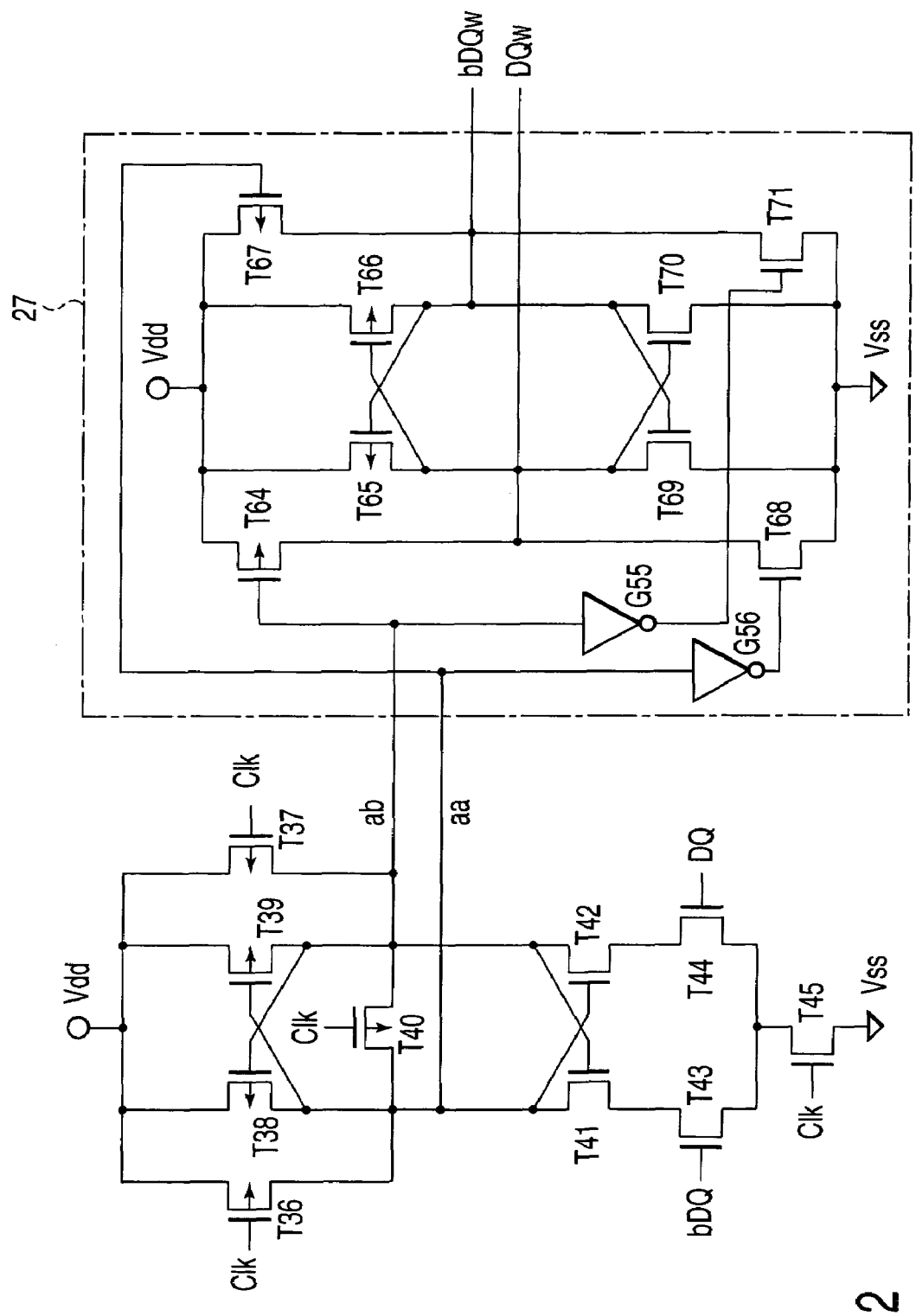
F I G. 12

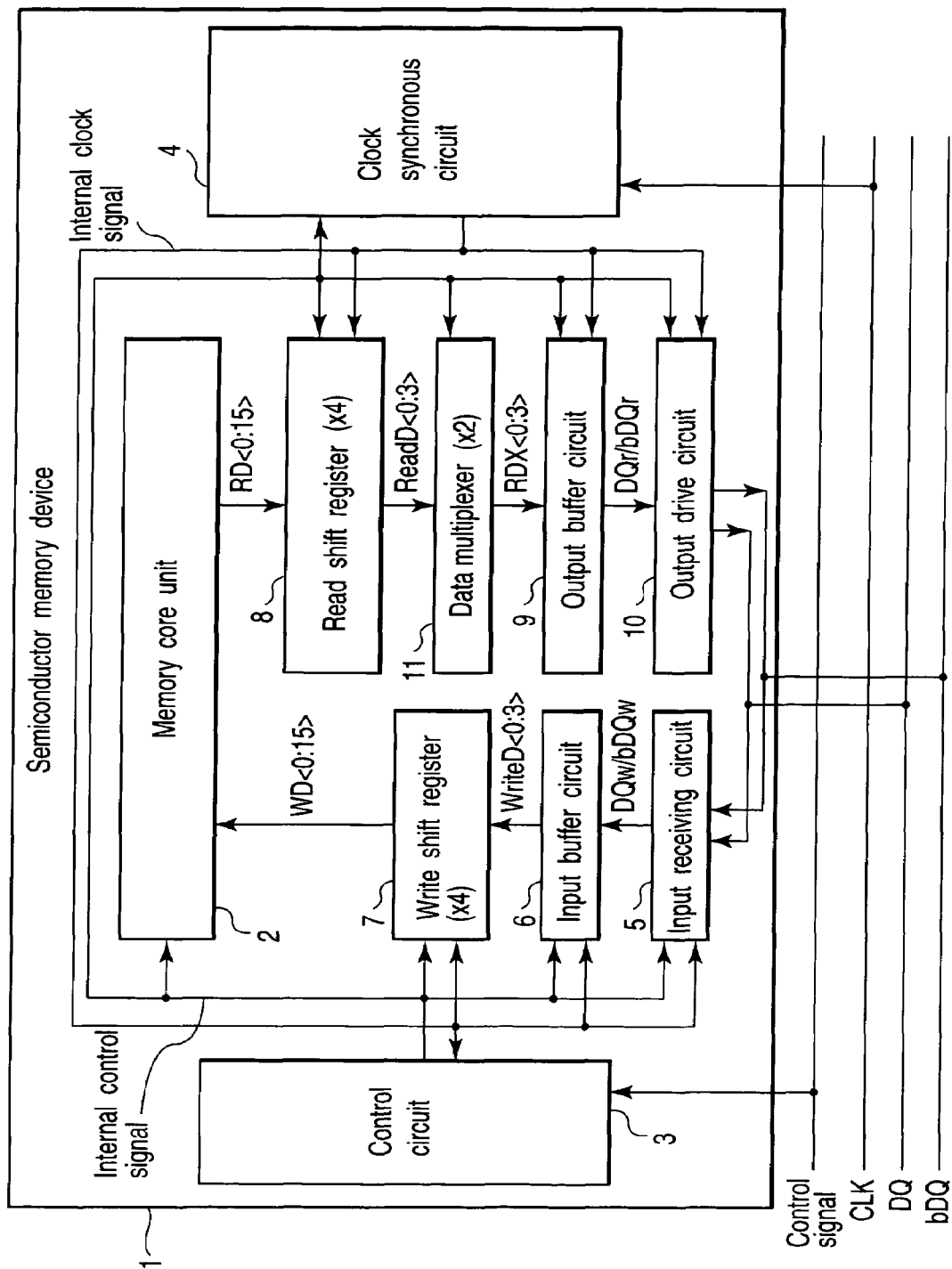
F I G. 21

DATA INPUT/OUTPUT CIRCUIT INCLUDED IN SEMICONDUCTOR MEMORY DEVICE

CROSS-REFERENCE TO RELATED APPLICATIONS

This application is based upon and claims the benefit of priority from prior Japanese Patent Application No. 2005-097936, filed Mar. 30, 2005, the entire contents of which are incorporated herein by reference.

BACKGROUND OF THE INVENTION

1. Field of the Invention

The present invention relates to a semiconductor memory device and, for example, to a data input/output circuit included in a semiconductor memory device.

2. Description of the Related Art

The data input/output speed of semiconductor memory devices is steadily increasing recently along with the progress of microfabrication of elements. Tests coping with the high-speed data input/output operation must be executed for such semiconductor memory devices.

However, a tester capable of conducting tests coping with the high-speed data input/output operation is expensive. For this reason, the cost of the test of semiconductor memory devices increases. More specifically, to execute a data input/output test for a semiconductor memory device capable of an input/output operation in synchronism with a high-frequency clock, a tester is necessary, which can transmit data at a speed corresponding to the high-frequency clock in a data write. In a data read, the tester must be able to compare output data with an expected value in a short time corresponding to the high-frequency and determine whether correct data is output. However, a tester capable of such a high-speed operation is expensive, and the cost of the test of semiconductor memory devices increases.

A semiconductor memory device has been proposed as a prior art related to the present invention. This device allows pulse generation of an internal sync signal ICLK in accordance with not only transition of an external clock CLK from Low level to High level but also level transition of another input. Hence, even a memory tester that obtains only a low-frequency external clock can conduct a test at a higher frequency beyond the performance of the memory tester (Jpn. Pat. Appln. KOKAI Publication No. 11-66894).

BRIEF SUMMARY OF THE INVENTION

According to a first aspect of the present invention, there is provided a semiconductor memory device comprising: a memory core unit which includes a plurality of memory cells selected by an address signal; a clock synchronous circuit which receives an external clock signal and generates a plurality of internal clock signals; a control circuit which receives an external control signal in synchronism with the internal clock signal generated by the clock synchronous circuit and generates the address signal and internal control signals; a data multiplexer which includes a plurality of input parallel data lines and a plurality of output parallel data lines and is switched to one of a first output state and a second output state in accordance with the internal control signal output from the control circuit, the data multiplexer outputting parallel data, which is input to the plurality of input parallel data lines and read out from the memory core unit, to the plurality of output parallel data lines corresponding to the plurality of input parallel data lines in the first output state and selecting 1-bit data of the parallel data input to the plurality of input parallel data lines and outputting the 1-bit data to the plurality of output parallel data lines in the second output state; a conversion circuit which converts the parallel data output from the data multiplexer into serial data; and an output drive circuit which outputs the serial data converted by the conversion circuit to an external data signal line.

According to a second aspect of the present invention, there is provided a semiconductor memory device comprising: a memory core unit which includes a plurality of memory cells selected by an address signal; a clock synchronous circuit which receives an external clock signal and generates a plurality of internal clock signals; a control circuit which receives an external control signal in synchronism with the internal clock signal generated by the clock synchronous circuit and generates the address signal and internal control signals; a shift register which converts n-bit (n is a natural number: $n \geq 2$) parallel data read out from the memory core unit into a plurality of m-bit (m is a natural number: $m<n$) serial data in synchronism with the internal clock signal generated by the clock synchronous circuit; a data multiplexer which includes a plurality of input parallel data lines and a plurality of output parallel data lines and is switched to one of a first output state and a second output state in accordance with the internal control signal output from the control circuit, the data multiplexer outputting the plurality of m-bit serial data input to the plurality of input parallel data lines to the plurality of output parallel data lines corresponding to the plurality of input parallel data lines in the first output state and selecting 1-bit data of the plurality of m-bit serial data input to the plurality of input parallel data lines and outputting the 1-bit data to the plurality of output parallel data lines in the second output state; an output buffer circuit which converts the parallel data output from the data multiplexer into serial data; and an output drive circuit which outputs the serial data converted by the output buffer circuit to an external data signal line.

According to a third aspect of the present invention, there is provided a semiconductor memory device comprising: a memory core unit which includes a plurality of memory cells selected by an address signal; a clock synchronous circuit which receives an external clock signal and generates a plurality of internal clock signals; a control circuit which receives an external control signal in synchronism with the internal clock signal generated by the clock synchronous circuit and generates the address signal and internal control signals; an input receiving circuit which switches between a state to detect data by comparing potentials of a complementary external data line pair and a state to detect data by comparing one of the potentials of the complementary external data line pair with a reference potential in accordance with the internal control signal generated by the control circuit; an input buffer circuit which outputs, as serial data, the data detected by the input receiving circuit; and a shift register which converts the serial data output from the input buffer circuit into parallel data and writes the parallel data in the memory cells of the memory core unit.

BRIEF DESCRIPTION OF THE SEVERAL VIEWS OF THE DRAWING

FIG. 2 is a circuit diagram showing the arrangement of the semiconductor memory device;

FIG. 12 is a circuit diagram of an input receiver (IR) in the input receiving circuit of the semiconductor memory device;

FIG. 21 is a block diagram showing the arrangement of a semiconductor memory device according to a second embodiment of the present invention;

DETAILED DESCRIPTION OF THE INVENTION

Figure 1:
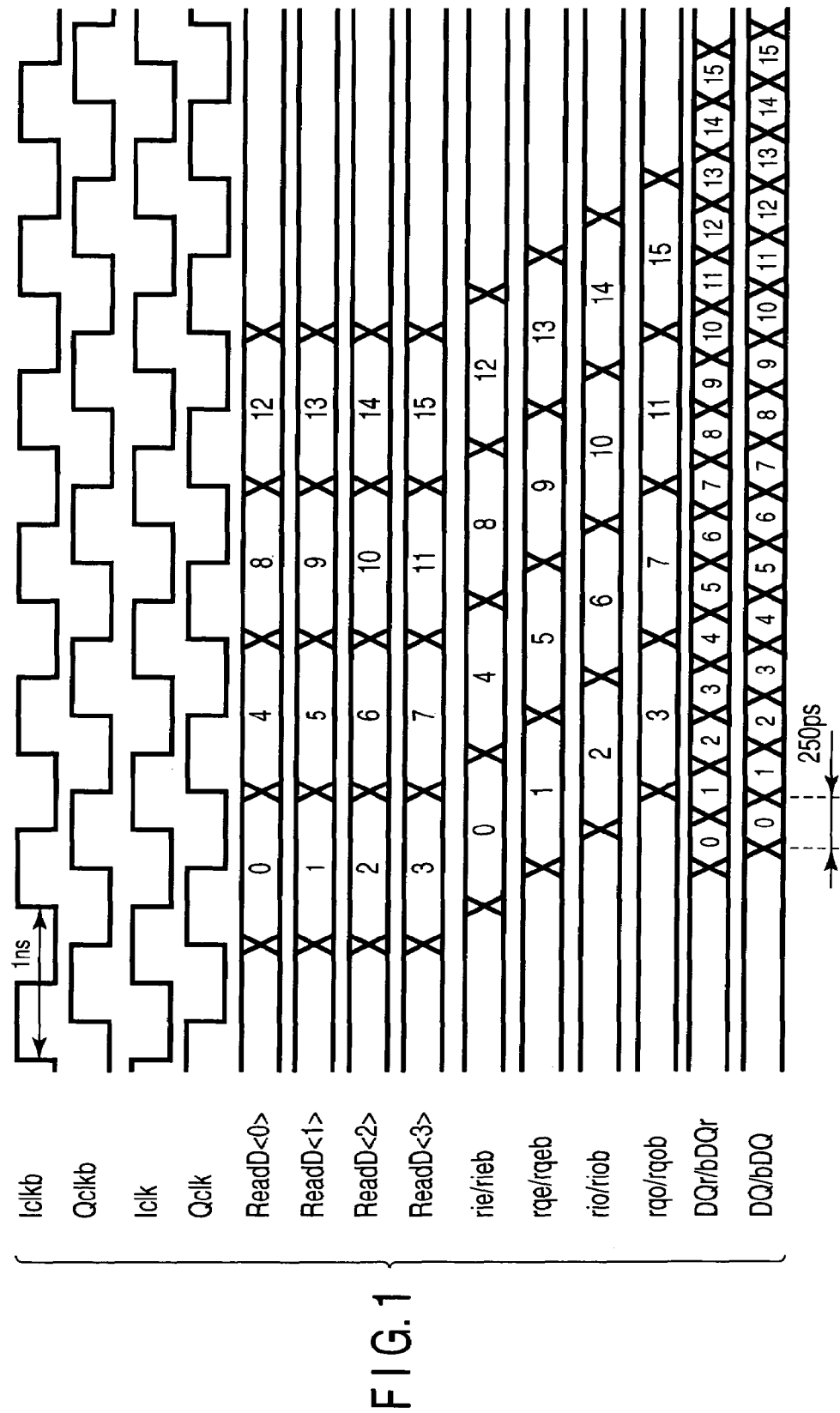
FIG. 1 is a timing chart showing voltage waveforms in a general high-frequency clock synchronization semiconductor memory device in the output operation.

Before an explanation of the embodiments of the present invention, an example of a data input/output circuit of a semiconductor memory device related to the present invention will be described. The data input/output operation speed of a semiconductor memory device is currently, e.g., about 4 Gbps (4 Gbit/sec) (input/output at $250 \times 10^{-12}$ sec per bit), as shown in FIG. 1. The data input/output operation of a semiconductor memory device which achieves a high-speed operation at 4 Gbps will be described.

FIG. 2 is a circuit diagram of a general high-frequency clock synchronization semiconductor memory device. A semiconductor memory device 1 is roughly divided into a memory core unit 2 and other interface circuits. The memory core unit 2 has a plurality of memory cells arrayed in a matrix. The interface circuits comprise a control circuit 3, clock synchronous circuit 4, input receiving circuit 5, input buffer circuit 6, write shift register 7, read shift register 8, output buffer circuit 9, and output drive circuit 10.

The control circuit 3 generates internal control signals to control the operations of the memory core unit 2 and other interface circuits in accordance with a control signal input from the outside. The clock synchronous circuit 4 generates a plurality of internal clock signals synchronized with an external clock signal CLK and supplies them to other interface circuits.

An operation of writing 16-bit serial (continuous) data from a pair of external data lines DQ and bDQ (bDQ is reversed data of DQ) in the semiconductor memory device 1 will be described. First, data at 4-Gbps (250 ps per bit) given to the pair of external data lines DQ and bDQ is detected and amplified by the input receiving circuit 5 in accordance with an internal control signal from the control circuit 3 and an internal clock from the clock synchronous circuit 4. The amplified data is subjected to waveform shaping and timing adjustment by the input buffer circuit 6 and input to the four write shift registers 7 as 4-bit serial data. Each write shift register 7 converts the 4-bit serial data into parallel data. Finally, 16-bit parallel data WD<0:15> is written in the memory core unit 2. In the memory core unit 2, the data is written and held in a memory cell of an address designated in accordance with the internal control signal from the control circuit 3.

An operation of reading out data written in the memory core unit 2 and outputting the data at a data rate of 4 Gbps will be described. First, 16-bit data is read out from the memory core unit 2 as parallel data RD<0:15> in accordance with the internal control signal from the control circuit 3. The parallel data RD<0:15> is converted by the four read shift registers 8 into 4-bit serial data.

Figure 3:
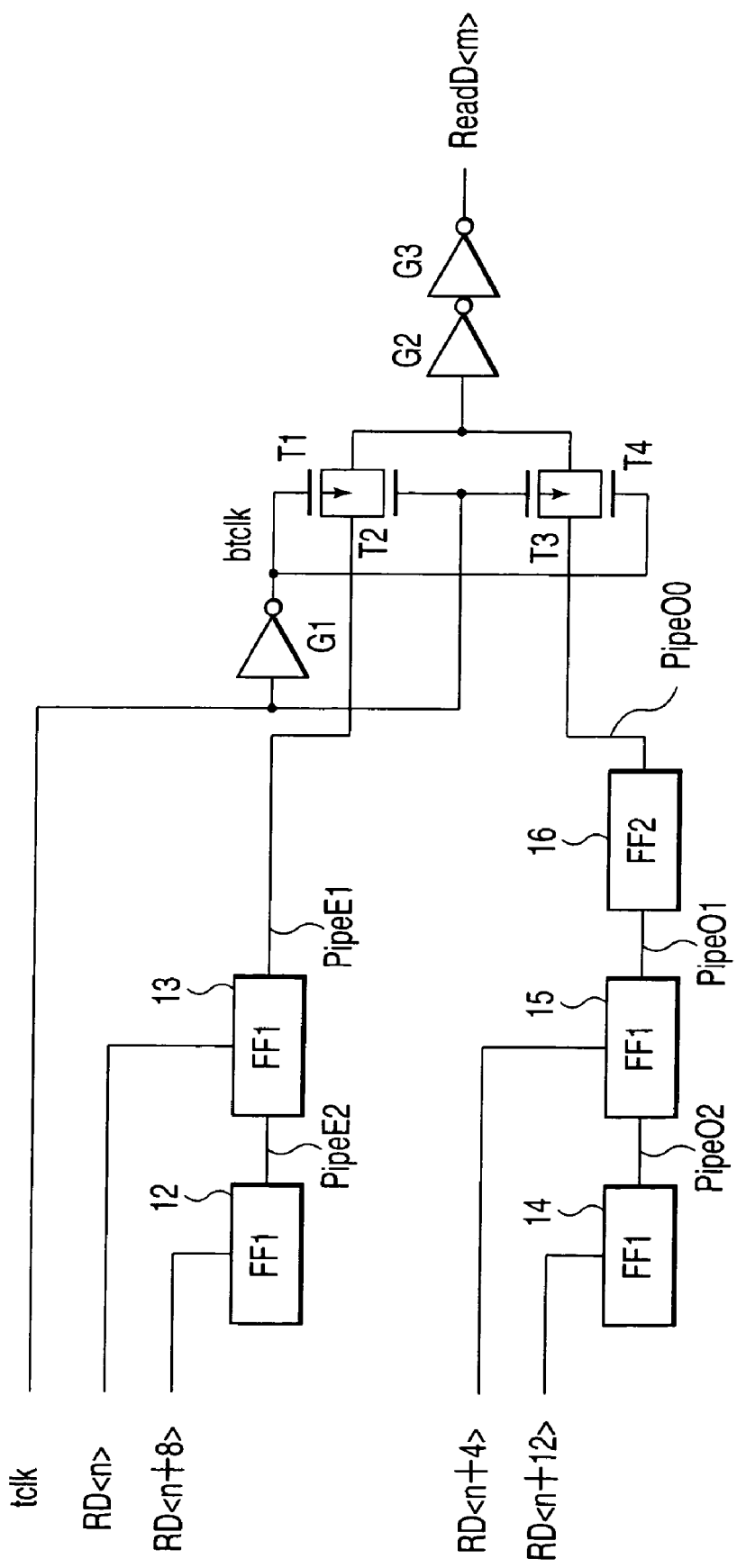
FIG. 3 is a circuit diagram of a read shift register of the semiconductor memory device.
Figure 4:
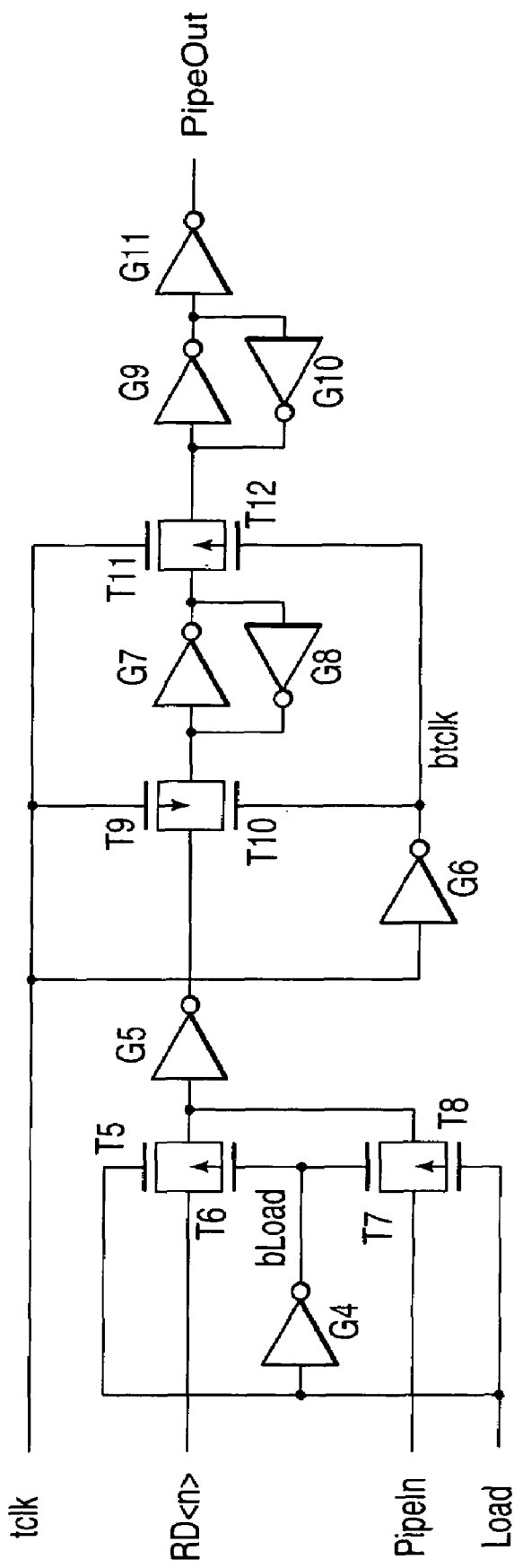
FIG. 4 is a circuit diagram of a flip-flop (FF1) included in the read shift register of the semiconductor memory device.
Figure 5:
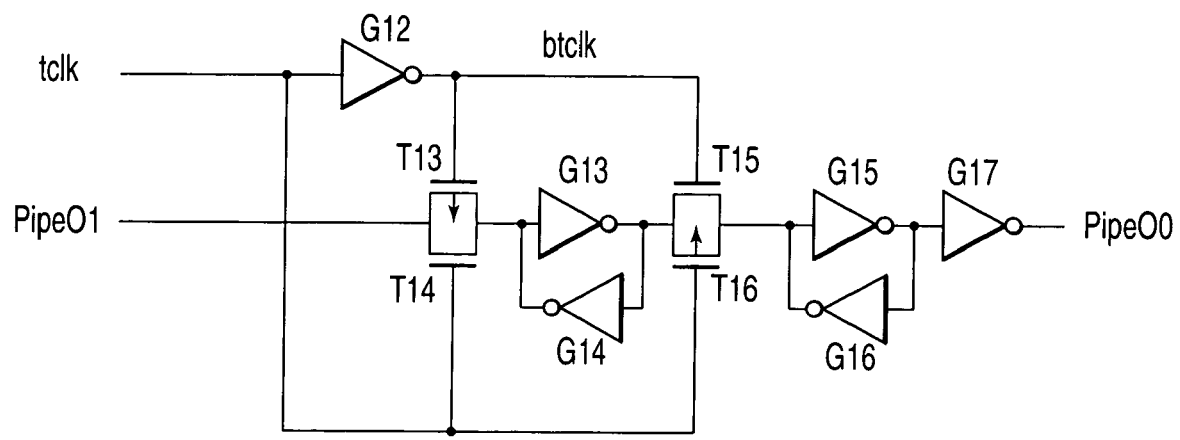
FIG. 5 is a circuit diagram of a flip-flop (FF2) included in the read shift register of the semiconductor memory device.
Figure 6:
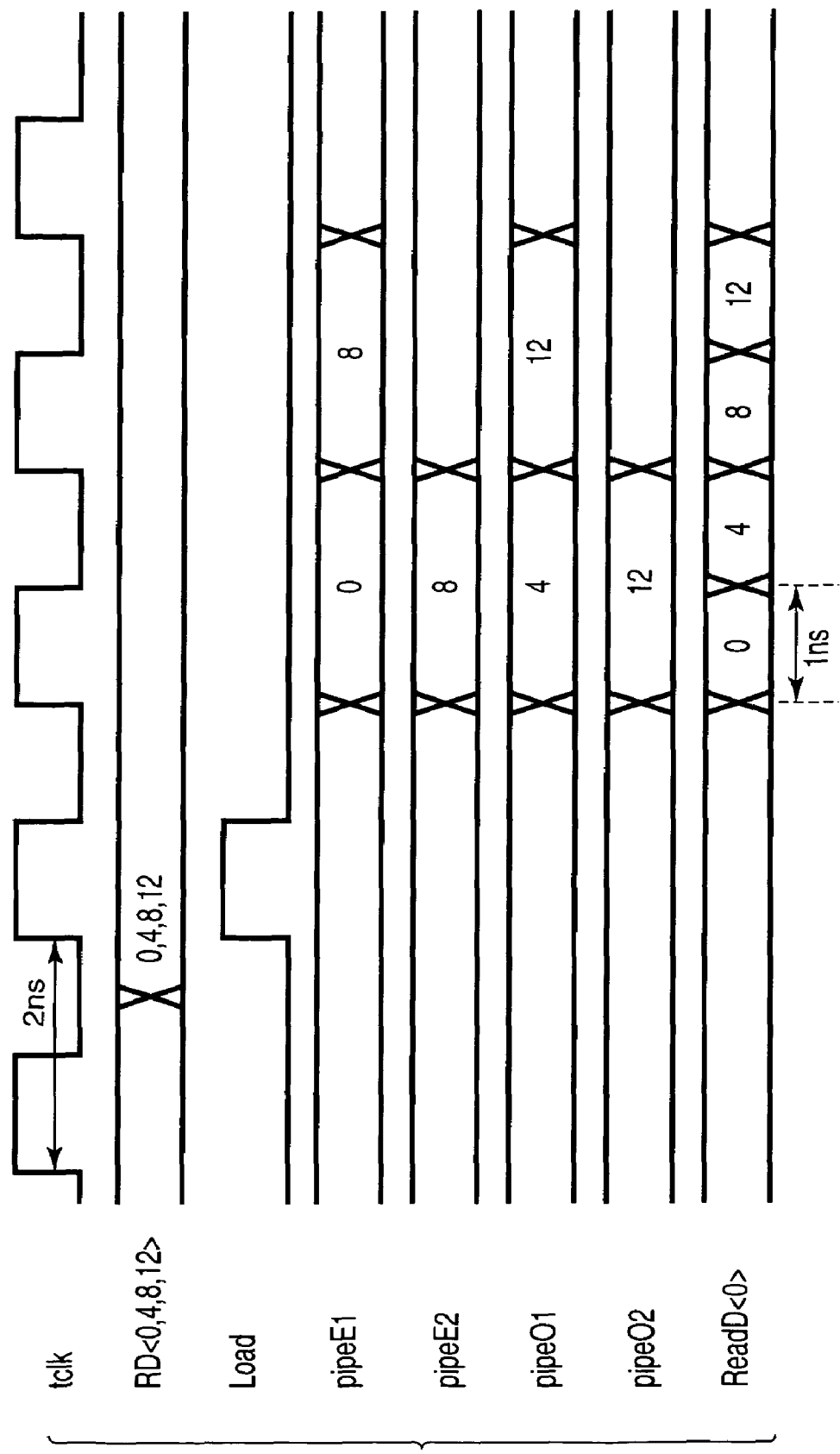
FIG. 6 is a timing chart showing voltage waveforms in the read shift register of the semiconductor memory device in the operation.

The arrangement and operation of the read shift register 8 will be described in detail with reference to FIGS. 3 to 6. FIG. 3 shows the circuit of one read shift register 8. FIGS. 4 and 5 show a flip-flop FF1 and a flip-flop FF2 included in the read shift register 8, respectively. FIG. 6 shows the voltage waveforms of the parts of the read shift register 8 in the operation.

As shown in FIG. 3, the read shift register 8 has the following arrangement. A flip-flop (FF1) 12 receives data RD<n+8> (n=0, 1, 2, 3) and outputs an output signal PipeE2. The output signal PipeE2 is input to a flip-flop (FF1) 13 which receives data RD<n>. An output signal PipeE1 from the flip-flop 13 which receives the data RD<n> is input to the common source (or drain) of a PMOS transistor T1 and an NMOS transistor T2. A signal btclk obtained by inverting an internal clock signal tclk by an inverter G1 is input to the gate of the transistor T1. The internal clock signal tclk is input to the gate of the transistor T2. A flip-flop (FF1) 14 receives data RD<n+12> and outputs an output signal PipeO2. The output signal PipeO2 is input to a flip-flop (FF1) 15 which receives data RD<n+4>.

An output signal PipeO1 from the flip-flop 15 which receives the data RD<n+4> is input to a flip-flop (FF2) 16. An output signal PipeO0 from the flip-flop 16 is input to the common source (or drain) of a PMOS transistor T3 and an NMOS transistor T4. The internal clock signal tclk is input to the gate of the transistor T3. The clock signal btclk is input to the gate of the transistor T4. The drains (or sources) of the transistors T1, T2, T3, and T4 are commonly connected to the input terminal of an inverter G2. The output terminal of the inverter G2 is connected to the input terminal of an inverter G3. The output from the inverter G3 is an output signal ReadD<m> (m=0, 1, 2, 3) from the read shift register.

The flip-flop FF1 shown in FIG. 4 has the following arrangement. The read data RD<n> read out from the memory core unit 2 is input to the common source (or drain) of an NMOS transistor T5 and a PMOS transistor T6. An internal control signal Load is input to the gate of the transistor T5. A signal bLoad obtained by inverting the internal control signal Load by an inverter G4 is input to the gate of the transistor T6. An output signal PipeIn from the flip-flop FF1 of the preceding stage is input to the common source (or drain) of an NMOS transistor T7 and a PMOS transistor T8. The signal bLoad is input to the gate of the transistor T7. The signal Load is input to the gate of the transistor T8. The drains (or sources) of the transistors T5, T6, T7, and T8 are commonly connected to the input terminal of an inverter G5.

The output terminal of the inverter G5 is connected to the common source (or drain) of a PMOS transistor T9 and an NMOS transistor T10. The internal clock signal tclk is input to the gate of the transistor T9. The signal btclk is input to the gate of the transistor T10. The drains (or sources) of the transistors T9 and T10 are commonly connected to the input terminal of an inverter G7 and the output terminal of an inverter G8.

The output terminal of the inverter G7 is commonly connected to the common source (or drain) of an NMOS transistor T11 and a PMOS transistor T12 and the input terminal of the inverter G8. The internal clock signal tclk is input to the gate of the transistor T11. The signal btclk is input to the gate of the transistor T12. The drains (or sources) of the transistors T11 and T12 are commonly connected to the input terminal of an inverter G9 and the output terminal of an inverter G10. The output terminal of the inverter G9 is commonly connected to the input terminal of the inverter G10 and the input terminal of an inverter G11. The output from the inverter G11 is an output signal PipeOut from the flip-flop FF1.

The flip-flop FF2 shown in FIG. 5 has the following arrangement. The output signal PipeO1 from the flip-flop (FF1) 15 of the preceding stage is input to the common source (or drain) of a PMOS transistor T13 and an NMOS transistor T14. The clock signal btclk obtained by inverting the internal clock signal tclk by an inverter G12 is input to the gate of the transistor T13. The internal clock signal tclk is input to the gate of the transistor T14. The drains (or sources) of the transistors T13 and T14 are commonly connected to the input terminal of the inverter G13 and the output terminal of an inverter G14.

The output terminal of the inverter G13 is commonly connected to the common source (or drain) of an NMOS transistor T15 and a PMOS transistor T16 and the input terminal of the inverter G14. The clock signal btclk is input to the gate of the transistor T15. The internal clock signal tclk is input to the gate of the transistor T16. The drains (or sources) of the transistors T15 and T16 are commonly connected to the input terminal of an inverter G15 and the output terminal of an inverter G16. The output terminal of the inverter G15 is commonly connected to the input terminal of the inverter G16 and the input terminal of an inverter G17. The output from the inverter G17 is the output signal PipeO0 from the flip-flop (FF2) 16.

The operation of the read shift register 8 will be described below with reference to FIG. 6. Of the four read shift registers 8, a shift register that receives data RD<0, 4, 8, 12> as input data will be exemplified. First, the memory core unit 2 outputs the 16-bit parallel data RD<0:15> in accordance with the internal control signal. Next, the internal control signal Load changes to "H" for a period corresponding to ½ of the clock in synchronism with the internal clock signal tclk. The transistors T5 and T6 in each flip-flop (FF1) are turned on so that the flip-flop (FF1) receives the data RD<0, 4, 8, 12>. At this time, since the clock signal tclk is "H", the transistors T9 and T10 are OFF. The data received by the flip-flop (FF1) propagates up to only the output terminal of the inverter G5. When the clock signal tclk changes to "L", the transistors T9 and T10 are turned on so that the output terminal of the inverter G5 is connected to the input terminal of the inverter G7. At this time, since the transistors T11 and T12 are OFF, the output terminal of the inverter G7 and the input terminal of the inverter G9 are not connected.

When the internal clock signal tclk changes to "H", the transistors T11 and T12 are turned on so that the output terminal of the inverter G7 is connected to the input terminal of the inverter G9. Hence, the read data is output from the output terminal of each flip-flop (FF1). That is, data RD<0> is output to the signal PipeE1 shown in FIG. 3. Data RD<8> is output to the signal PipeE2. In addition, data RD<4> is output to the signal PipeO1. Data RD<12> is output to the signal PipeO2.

At this time, since the clock signal tclk is "H", the transistors T1 and T2 are ON, and the transistors T3 and T4 are OFF. Hence, the signal PipeE1 is input to the input terminal of the inverter G2, and the data RD<0> is output as a signal ReadD<0>.

On the other hand, the transistors T13 and T14 in the flip-flop (FF2) 16 are ON so that the signal PipeO1 is input to the input terminal of the inverter G13. However, since the transistors T15 and T16 are OFF, the output terminal of the inverter G13 and the input terminal of the inverter G15 are not connected.

When the clock signal tclk changes to "L", the transistors T9 and T10 in the flip-flop (FF1) are turned on so that the output terminal of the inverter G5 is connected to the input terminal of the inverter G7. The signal Load is "L". Hence, in the flip-flop (FF1) 13 to output the signal PipeE1, the signal PipeE2 is input to the input terminal of the inverter G5 and propagates up to the output terminal of the inverter G7. Similarly, in the flip-flop (FF1) 15 to output the signal PipeO1, the signal PipeO2 is input to the input terminal of the inverter G5 and propagates up to the output terminal of the inverter G7. In addition, the transistors T15 and T16 in the flip-flop (FF2) 16 are turned on so that the output terminal of the inverter G13 is connected to the input terminal of the inverter G15. Hence, the data RD<4> is output to the output terminal of the flip-flop (FF2) 16. At this time, the transistors T1 and T2 of the read shift register 8 are turned off, and the transistors T3 and T4 are turned on. Hence, the signal PipeO0 is input to the input terminal of the inverter G2, and the data RD<4> is output as the signal ReadD<0>.

When the clock signal tclk changes to "H", the data RD<8> is output as the signal ReadD<0> by the same operation as described above. When the clock signal tclk changes to "L" then, the data RD<12> is output as the signal ReadD<0>.

The same operation is executed even in the three remaining shift registers. Hence, in the read shift registers 8, 16-bit parallel data is converted into 4-bit (×4) serial data.

Figure 7:
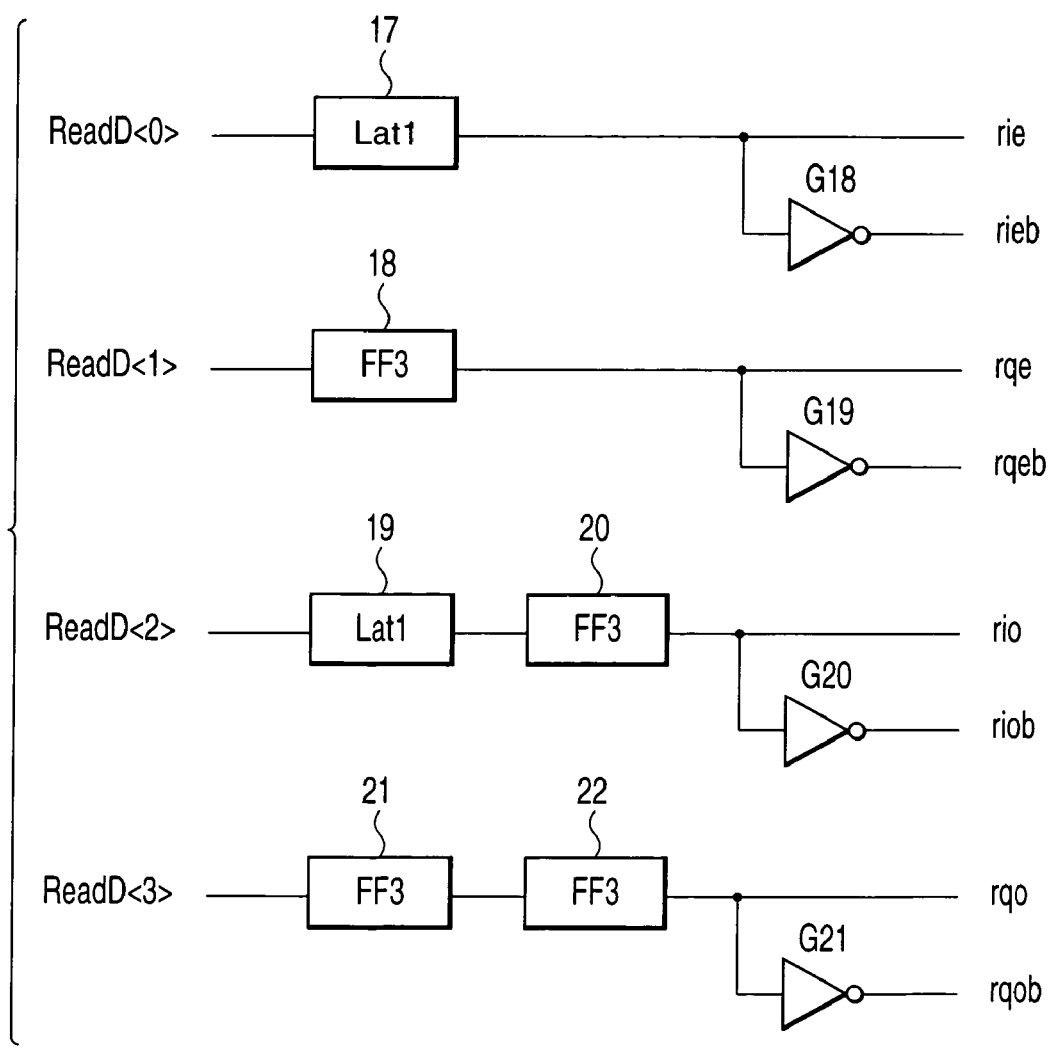
FIG. 7 is a circuit diagram of an output buffer circuit of the semiconductor memory device.
Figure 8:
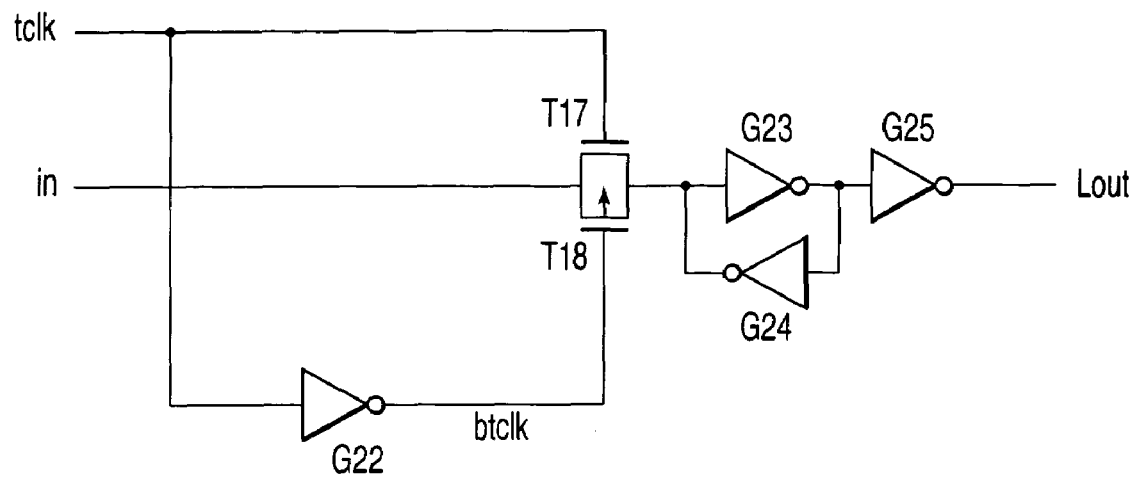
FIG. 8 is a circuit diagram of a latch circuit (Lat1) in the output buffer circuit of the semiconductor memory device.
Figure 9:
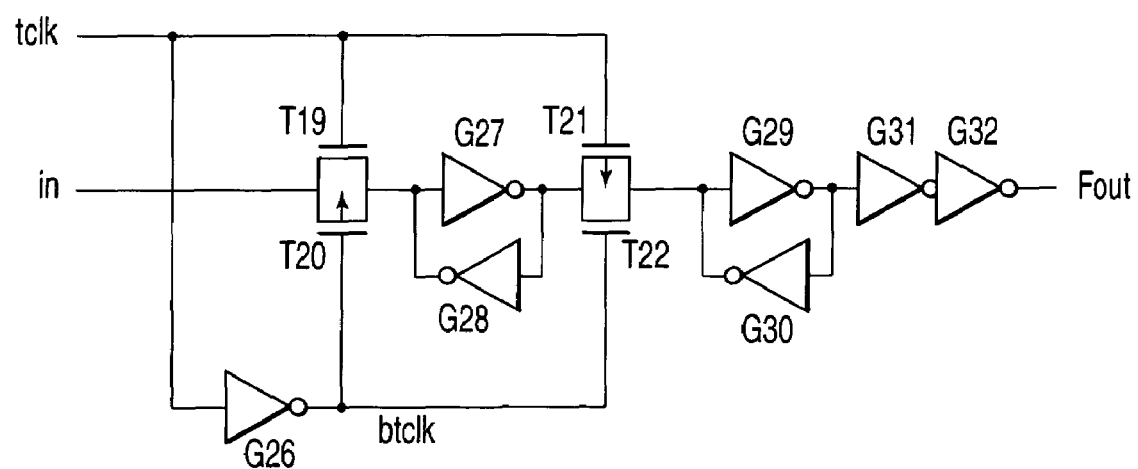
FIG. 9 is a circuit diagram of a flip-flop (FF3) in the output buffer circuit of the semiconductor memory device.
Figure 10:
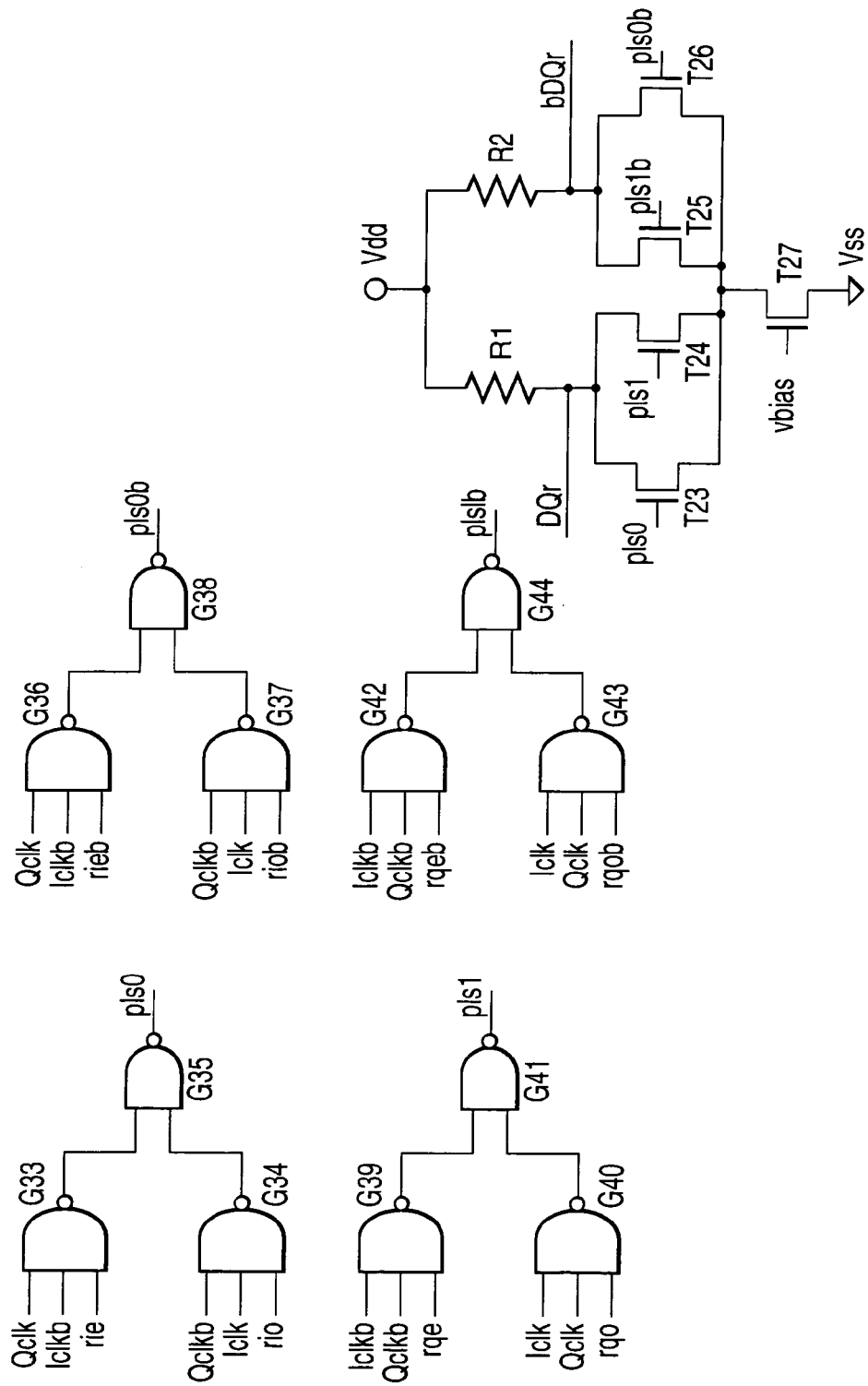
FIG. 10 is a circuit diagram of a serial data conversion circuit in the output buffer circuit of the semiconductor memory device.

The 4-bit (×4) serial data is converted into 16-bit serial data by the output buffer circuit 9 shown in FIG. 2. The arrangement and operation of the output buffer circuit 9 will be described with reference to FIGS. 7 to 10. FIG. 7 shows the arrangement of a circuit which shifts the data output timing by a ½ period of the internal clock signal in the output buffer circuit 9. FIG. 8 shows the arrangement of a latch circuit (Lat1) in FIG. 7. FIG. 9 shows the arrangement of a flip-flop (FF3) in FIG. 7. FIG. 10 shows the arrangement of a circuit which converts 4-bit (×4) serial data into 16-bit serial data in the output buffer circuit 9. FIG. 1 shows the voltage waveforms of the main parts of the semiconductor memory device in the output operation.

Referring to FIG. 7, of the four read shift registers 8, the first shift register inputs the output signal ReadD<0> to a latch circuit (Lat1) 17. The output from the latch circuit (Lat1) 17 is a signal rie. The signal rie is input to an inverter G18. The output from the inverter G18 is an inverted signal rieb of the signal rie. The second shift register inputs an output signal ReadD<1> to a flip-flop (FF3) 18. The output from the flip-flop (FF3) 18 is a signal rqe. The signal rqe is input to an inverter G19. The output from the inverter G19 is an inverted signal rqeb of the signal rqe. The third shift register inputs an output signal ReadD<2> to a latch circuit (Lat1) 19. The output signal from the latch circuit (Lat1) 19 is input to a flip-flop (FF3) 20. The output from the flip-flop 20 is a signal rio. The signal rio is input to an inverter G20. The output from the inverter G20 is an inverted signal riob of the signal rio. The fourth shift register inputs an output signal ReadD<3> to a flip-flop (FF3) 21. The output from the flip-flop 21 is input to a flip-flop (FF3) 22 of the next stage. The output from the flip-flop 22 is a signal rqo. The signal rqo is input to an inverter G21. The output from the inverter G21 is an inverted signal rqob of the signal rqo.

The latch circuit (Lat1) shown in FIG. 8 has the following arrangement. An input signal in is input to the common source (or drain) of an NMOS transistor T17 and a PMOS transistor T18. The internal clock signal tclk is input to the gate of the transistor T17. The signal btclk obtained by inverting the clock signal tclk by an inverter G22 is input to the gate of the transistor T18. The drains (or sources) of the transistors T17 and T18 are commonly connected to the input terminal of an inverter G23 and the output terminal of an inverter G24. The output terminal of the inverter G23 is connected to the input terminals of the inverters G24 and G25. The output from the inverter G25 is an output signal Lout from the latch circuit (Lat1).

The operation of the latch circuit (Lat1) with the arrangement shown in FIG. 8 will briefly be described. During the "L" period of the clock signal tclk, the transistors T17 and T18 are OFF, and the signal in is not input to the input terminal of the inverter G23. When the clock signal tclk changes to "H", the transistors T17 and T18 are turned on so that the signal in is input to the input terminal of the inverter G23 and output as the output signal Lout from the latch circuit (Lat1). When the clock signal tclk changes to "L" again, the transistors T17 and T18 are turned off so that the signal in is disconnected from the input terminal of the inverter G23. However, since data received during the "H" period of the clock signal tclk is held by the inverters G23 and G24, output of the output signal Lout is maintained.

The flip-flop (FF3) shown in FIG. 9 has the following arrangement. The input signal in connected to the common source (or drain) of an NMOS transistor T19 and a PMOS transistor T20. The internal clock signal tclk is input to the gate of the transistor T19. The signal btclk obtained by inverting the clock signal tclk by an inverter G26 is input to the gate of the transistor T20. The drains (or sources) of the transistors T19 and T20 are commonly connected to the input terminal of an inverter G27 and the output terminal of an inverter G28.

The output terminal of the inverter G27 is connected to the common source (or drain) of a PMOS transistor T21 and an NMOS transistor T22 and the input terminal of the inverter G28. The clock signal tclk is input to the gate of the transistor T21. The clock signal btclk is input to the gate of the transistor T22. The drains (or sources) of the transistors T21 and T22 are commonly connected to the input terminal of an inverter G29 and the output terminal of an inverter G30. The output terminal of the inverter G29 is connected to the input terminals of the inverters G30 and G31. The output terminal of the inverter G31 is connected to the input terminal of an inverter G32. The output from the inverter G32 is an output signal from the flip-flop (FF3).

The operation of the flip-flop (FF3) with the above-described arrangement will briefly be described. During the "L" period of the clock signal tclk, the transistors T19 and T20 are OFF, and the signal in is not input to the input terminal of the inverter G27. When the clock signal tclk changes to "H", the transistors T19 and T20 are turned on so that the signal in is input to the input terminal of the inverter G27, and the inverted signal of the signal in is output to the output terminal of the inverter G27. At this time, since the transistors T21 and T22 are OFF, the output terminal of the inverter G27 is not connected to the input terminal of the inverter G29.

When the clock signal tclk changes to "L", the transistors T19 and T20 are turned off so that the signal in is disconnected from the input terminal of the inverter G27. However, since data received during the "H" period of the clock signal tclk is held by the inverters G27 and G28, output from the inverter G27 is maintained. In addition, since the transistors T1 and T22 are turned on, the output terminal of the inverter G27 is connected to the input terminal of the inverter G29. Hence, data received during the "H" period of the clock signal tclk is output as the output signal Fout.

Next, when the clock signal tclk changes to "H", the transistors T21 and T22 are turned off so that the output terminal of the inverter G27 is disconnected from the input terminal of the inverter G29. However, the data of the output signal Fout is held by the inverters G29 and G30. Since the transistors T19 and T20 are turned on, the signal in is input to the input terminal of the inverter G27, and the next data on the signal in is received by the flip-flop (FF3). The above-described operation is repeated in every transition of the clock signal tclk.

The arrangement of a circuit shown in FIG. 10, which converts 4-bit (×4) serial data into 16-bit serial data in the output buffer circuit 9, will be described next.

A NAND gate G33 receives an internal clock signal Qclk generated by the clock synchronous circuit 4, a clock signal Iclkb as the inverted signal of an internal clock signal Iclk, and the signal rie. A NAND gate G34 receives a clock signal Qclkb as the inverted signal of the internal clock signal Qclk, the clock signal Iclk, and the signal rio. The output terminals of the NAND gates G33 and G34 are connected to the input terminal of a NAND gate G35. An output from the NAND gate G35 is a signal pls0. A NAND gate G36 receives the internal clock signal Qclk, clock signal Iclkb, and signal rieb. A NAND gate G37 receives the clock signal Qclkb, clock signal Iclk, and signal riob. The output terminals of the NAND gates G36 and G37 are connected to the input terminal of a NAND gate G38. An output from the NAND gate G38 is a signal pls0$b$.

A NAND gate G39 receives the clock signal Iclkb, clock signal Qclkb, and signal rqe. A NAND gate G40 receives the clock signal Iclk, clock signal Qclk, and signal rqo. The output terminals of the NAND gates G39 and G40 are connected to the input terminal of a NAND gate G41. An output from the NAND gate G41 is a signal pls1. A NAND gate G42 receives the clock signal Iclkb, clock signal Qclkb, and signal rqeb. A NAND gate G43 receives the clock signal Iclk, clock signal Qclk, and signal rqob. The output terminals of the NAND gates G42 and G43 are connected to the input terminal of a NAND gate G44. An output from the NAND gate G44 is a signal pls1$b$.

The signals pls0, pls1, pls0$b$, and pls1$b$ are connected to the gates of NMOS transistors T23, T24, T26, and T25, respectively. The sources of the transistors T23, T24, T25, and T26 are commonly connected to the drain of an NMOS transistor T27. A constant current source control signal vbias from the control circuit 3 is input to the gate of the transistor T27. The source of the transistor T27 is connected to a ground potential Vss. The drains of the transistors T23 and T24 are connected to one terminal of a resistor R1. A signal DQr is output from these drains as the output from the output buffer circuit 9. The drains of the transistors T25 and T26 are connected to one terminal of a resistor R2. A signal bDQr is output from these drains as the output from the output buffer circuit 9. The other terminal of each of the resistors R1 and R2 is commonly connected to a power supply voltage Vdd.

The operation of the output buffer circuit 9 shown in FIGS. 7 to 10 will be described with reference to the timing chart shown in FIG. 1. The clock signals Iclk and Qclk output from the clock synchronous circuit 4 in synchronism with the external clock signal CLK maintain a phase difference of 90°. The clock signal Iclk, inverted signal Iclkb, clock signal Qclk, and inverted signal Qclkb repeat "H" and "L" at the same period. An output signal ReadD<0:3> from the read shift register 8 is input to the circuit shown in FIG. 7. Timing adjustment is done by the operation of the above-described latch circuit (Lat1) and flip-flop (FF3) such that the timing is shifted every ¼ period of the internal clock signal. Hence, the signals rie, rio, rqe, and rqo and inverted signals thereof are output.

The output from the circuit shown in FIG. 7 is input to the circuit shown in FIG. 10. First, the <0>th data of the signal ReadD<0> is output as the signals rie and rieb. At this time, since both the clock signals Qclk and Iclkb are "H", one of the NAND gates G33 and G36 outputs "H" in accordance with the polarities of the signals rie and rieb. On the other hand, the NAND gates G34 and G37 output "H" because the clock signals Qclkb and Iclk are "μL". Hence, "H" is output to one of the signals pls0 and pls0$b$ during only the "H" period of the clock signals Iclk and Qclkb. For example, if the signal rie is "H", "H" is output to the signal pls0, and "L" is output to the signal pls0$b$.

On the other hand, since at least one of the input terminals of the NAND gates G39, G49, G42, and G43 is "L", both the signals pls1 and pls1$b$ are "L". The transistor T23 or T26 is turned on by the "H" pulse output to the signal pls0 or pls0$b$, and the signal DQr or bDQr changes to "L". For example, when "H" is output to the signal pls0, the transistor T23 is turned on, and the signal DQr changes to "L". At this time, the signal bDQr remains "H".

Next, the clock signal Qclk changes to "L" (the clock signal Qclkb changes to "H"), and both the signals pls0 and pls0$b$ change to "L". One of the NAND gates G39 and G42 outputs "H" in accordance with the polarities of the signals rqe and rqeb. The NAND gates G40 and G43 output "H" because the clock signals Qclk and Iclk are "L". Hence, "H" is output to one of the signals pls1 and pls1$b$ during only the "H" period of the clock signals Iclkb and Qclkb. For example, if the signal rqeb is "H", "H" is output to the signal pls1$b$, and "L" is output to the signal pls1$b$. Since at least one of the input terminals of the NAND gates G33, G34, G36, and G37 is "L", both the signals pls0 and pls0$b$ are "L". The transistor T24 or T25 is turned on by the "H" pulse output to the signal pls1 or pls1$b$ , and the signal DQr or bDQr changes to "L". For example, when "H" is output to the signal pls1$b$, the transistor T25 is turned on, and the signal bDQr changes to "L". At this time, the signal DQr remains "H".

Next, the clock signal Iclk changes to "H" (the clock signal Iclkb changes to "L"), and both the signals pls1 and pls1$b$ change to "L". One of the NAND gates G34 and G47 outputs "H" in accordance with the polarities of the signals rio and riob. The NAND gates G33 and G36 output "H" because the clock signals Qclk and Iclkb are "L". Hence, "H" is output to one of the signals pls0 and pls0$b$ during only the "H" period of the clock signals Iclk and Qclkb. For example, if the signal riob is "H", "H" is output to the signal pls0$b$, and "L" is output to the signal pls0.

Since at least one of the input terminals of the NAND gates G39, G40, G42, and G43 is "L", both the signals pls1 and pls1$b$ are "L". The transistor T23 or T26 is turned on by the "H" pulse output to the signal pls0 or pls0$b$, and the signal DQr or bDQr changes to "L". For example, when "H" is output to the signal pls0$b$, the transistor T26 is turned on, and the signal bDQr changes to "L". At this time, the signal DQr remains "H".

Next, the clock signal Qclk changes to "H" (the clock signal Qclkb changes to "L"), and both the signals pls0 and pls0$b$ change to "L". One of the NAND gates G40 and G43 outputs "H" in accordance with the polarities of the signals rqo and rqob. The NAND gates G39 and G42 output "H" because the clock signals Qclkb and Iclkb are "L". Hence, "H" is output to one of the signals pls1 and pls1b during only the "H" period of the clock signals Iclk and Qclk. For example, if the signal rqo is "H", "H" is output to the signal pls1, and "L" is output to the signal pls0b.

Since at least one of the input terminals of the NAND gates G33, G34, G36, and G37 is "L", both the signals pls0 and pls0b are "L". The transistor T24 or T25 is turned on by the "H" pulse output to the signal pls1 or pls1b, and the signal DQr or bDQr changes to "L". For example, when "H" is output to the signal pls1, the transistor T24 is turned on, and the signal DQr changes to "L". At this time, the signal bDQr remains "H".

The clock signal Iclkb changes to "H" again to output the data of the signals rio and riob as the signals DQr and bDQr by the above-described operation. By repeating this operation, the 4-bit (×4) serial data which has undergone timing adjustment by the circuit shown in FIG. 7 is converted into 16-bit serial data by the circuit shown in FIG. 10. The data is output every ¼ period of the internal clock signal. If the internal clock frequency is 1 GHz, the data is output at 250 ps per bit.

To execute a test before shipment for the semiconductor memory device that executes the input/output operation in synchronism with the high-frequency clock, a tester is necessary, which compares output data with an expected value within 250 ps and determines whether correct data is output. However, a tester capable of such a high-speed operation is expensive, and the cost of the test of the semiconductor memory device increases.

Even in writing data in the semiconductor memory device, data output at the same data rate is necessary. That is, the tester outputs 16-bit serial data at a data rate of 4 Gbps (250 ps per bit).

Figure 11:
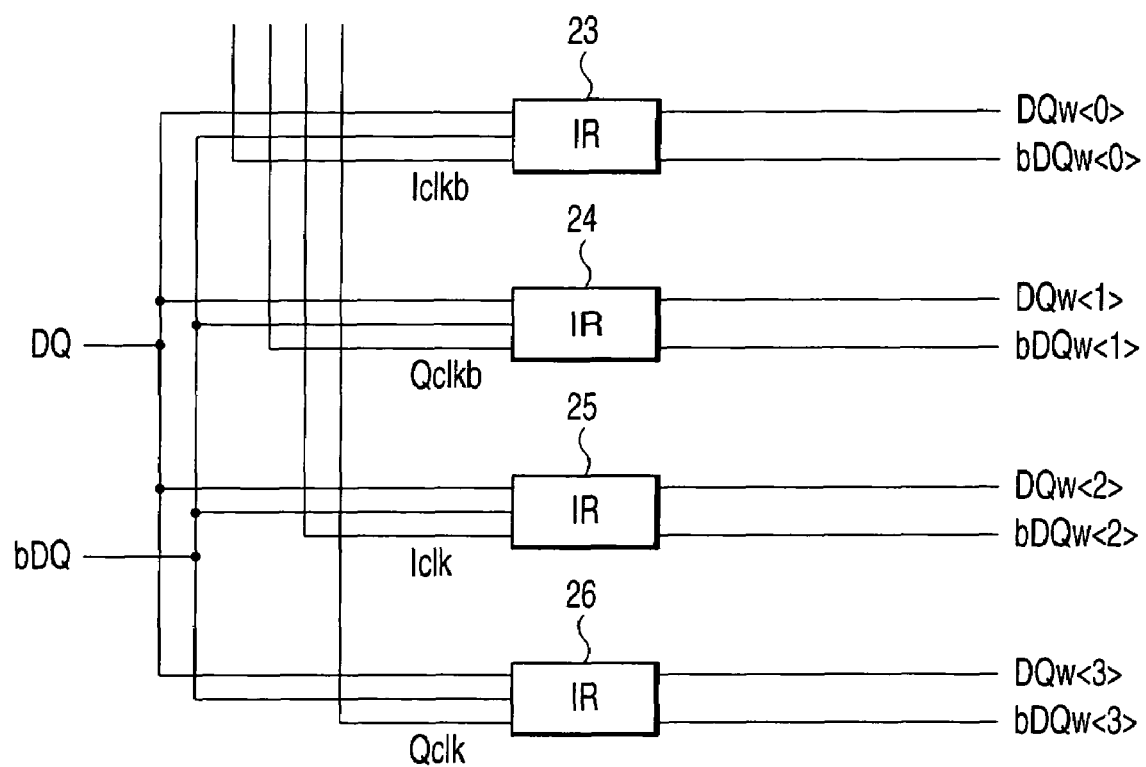
FIG. 11 is a circuit diagram of an input receiving circuit of the semiconductor memory device.
Figure 13:
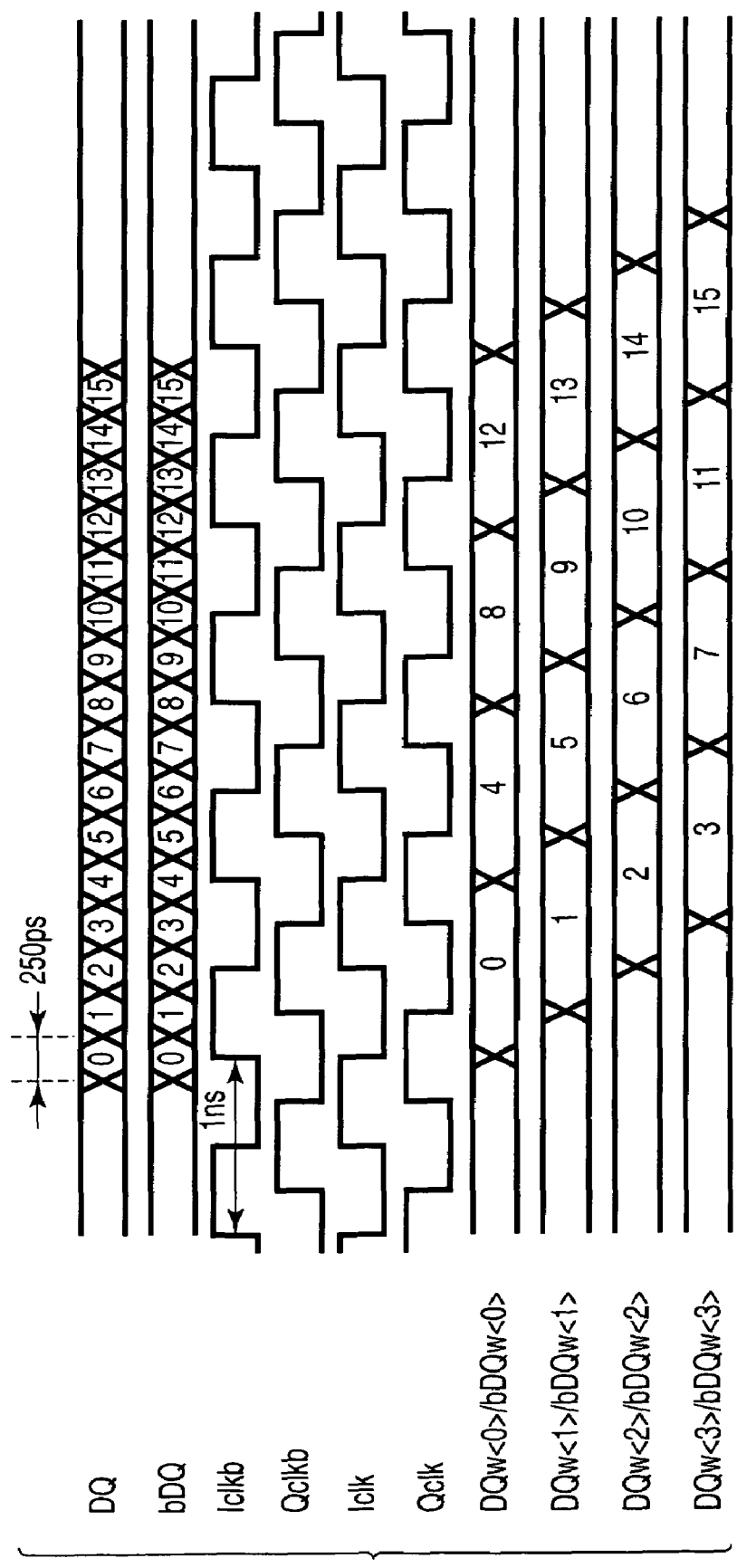
FIG. 13 is a timing chart showing voltage waveforms in the input receiver (IR) of the semiconductor memory device in the operation.

The arrangement and operation of the serial data which detects and amplifies the data of the external data lines DQ and bDQ will be described with reference to FIGS. 11 to 13. FIG. 11 is a schematic circuit diagram showing the arrangement of the input receiving circuit 5 corresponding to the external data lines DQ and bDQ. FIG. 12 is a detailed circuit diagram of an input receiver (IR) in the input receiving circuit 5. Four input receivers (IR) are provided in correspondence with one set of external data lines DQ and bDQ. Input receivers (IR) 23 to 26 receive data in synchronism with the clock signals Iclk, Qclk, Iclkb, and Qclkb with a phase shift of 90° from the clock synchronous circuit 4.

Each of the input receivers (IR) 23 to 26 shown in FIG. 12 has the following arrangement. A signal Clk in FIG. 12 indicates one of the clock signals Iclk, Qclk, Iclkb, and Qclkb. Each input receiver (IR) has PMOS transistors T36, T37, and T40. The internal clock signal Clk is input to the gates of these transistors. The source of the transistor T36 is connected to the power supply voltage Vdd. The drain of the transistor T36 is connected to a signal aa. The source of the transistor T37 is connected to the power supply voltage Vdd. The drain of the transistor T37 is connected to a signal ab. The source (or drain) of the transistor T40 is connected to the signal aa. The drain (or source) of the transistor T40 is connected to the signal ab.

The source of a PMOS transistor T38 is connected to the power supply voltage Vdd. The drain of the transistor T38 is connected to the signal aa. The signal ab is input to the gate of the transistor T38. The source of a PMOS transistor T39 is connected to the power supply voltage Vdd. The drain of the transistor T39 is connected to the signal ab. The signal aa is input to the gate of the transistor T39. The source of an NMOS transistor T41 is connected to the drain of an NMOS transistor T43. The drain of the transistor T41 is connected to the signal aa. The signal ab is input to the gate of the transistor T41. The source of an NMOS transistor T42 is connected to the drain of an NMOS transistor T44. The drain of the transistor T42 is connected to the signal ab. The signal aa is input to the gate of the transistor T42. The signals bDQ and DQ are input to the gates of the transistors T43 and T44, respectively. The sources of the transistors T43 and T44 are commonly connected to the drain of an NMOS transistor T45. The clock signal Clk is input to the gate of the transistor T45. The source of the transistor T45 is connected to the ground potential Vss.

A latch circuit 27 receives the signals aa and ab and latches and outputs the values of signals DQw and bDQw. The source of a PMOS transistor T67 is connected to the power supply voltage Vdd. The drain of the transistor T67 is connected to the output signal bDQw. The signal aa is input to the gate of the transistor T67. The source of an NMOS transistor T68 is connected to the ground potential Vss. The drain of the transistor T68 is connected to the signal DQw. A signal obtained by inverting the signal aa by an inverter G56 is input to the gate of the transistor T68. The source of a PMOS transistor T64 is connected to the power supply voltage Vdd. The drain of the transistor T64 is connected to the output signal DQw. The signal ab is input to the gate of the transistor T64.

The source of an NMOS transistor T71 is connected to the ground potential Vss. The drain of the transistor T71 is connected to the signal bDQw. A signal obtained by inverting the signal ab by an inverter G55 is input to the gate of the transistor T71. The source of a PMOS transistor T66 is connected to the power supply voltage Vdd. The drain of the transistor T66 is connected to the signal bDQw. The signal DQw is input to the gate of the transistor T66. The source of an NMOS transistor T70 is connected to the ground potential Vss. The drain of the transistor T70 is connected to the signal bDQw. The signal DQw is input to the gate of the transistor T70. The source of a PMOS transistor T65 is connected to the power supply voltage Vdd. The drain of the transistor T65 is connected to the signal DQw. The signal bDQw is input to the gate of the transistor T65. The source of an NMOS transistor T69 is connected to the ground potential Vss. The drain of the transistor T69 is connected to the signal DQw. The signal bDQw is input to the gate of the transistor T69.

The operation of the input receiver (IR) will be described with reference to FIG. 13. The input receiver 23 which operates in synchronism with the clock signal Iclkb and outputs signals DQw<0> and bDQw<0> will be exemplified. During the "L" period of the clock signal Iclkb, the transistor T45 is OFF, and the input receiver does not detect the signals DQ and bDQ. On the other hand, the transistors T36, T37, and T40 are ON. The signals aa and ab are short-circuited by the transistor T40 to have an equipotential and also precharged to the power supply voltage Vdd by the transistors T36 and T37. Hence, all the transistors T64, T67, T68, and T71 are OFF, and the signals DQw and bDQw are in a floating state.

When the clock signal Iclkb changes to "H", transistors T36, T37, and T40 are turned off. On the other hand, the transistor T45 is turned on. For this reason, the potential difference between the signals DQ and bDQ can be detected by the transistors T43 and T44. The potential difference is amplified by the transistors T38, T39, T41, and T42 and output as the signals aa and ab. For example, when the potential of the signal DQ is higher than that of the signal bDQ, and the clock signal Iclkb changes to "H" in this state, the transistor T44 is turned on to decrease the potential of the signal ab. When the potential of the signal ab decreases, the transistor T38 is turned on, and the transistor T41 is turned off. The signal aa maintains the power supply voltage Vdd. Since the signal aa has the power supply voltage Vdd, the transistor T39 is turned off, and the transistor T42 is turned on. The potential of the signal ab further decreases and finally reaches the ground potential Vss. The latch circuit 27 receives the signals aa and ab and latches and outputs the signals DQw and bDQw.

The operation of the input receiving circuit 5 will be described next with reference to FIG. 13. From the external data lines DQ and bDQ, 16-bit serial data is input to the semiconductor memory device at a data rate of 4 Gbps (250 ps per bit). The internal clock signals Iclkb, Qclkb, Iclk, and Qclk of 1 GHz from the clock synchronous circuit 4 are supplied to the four input receivers. When the clock signal Iclkb changes to "H", the first input receiver 23 executes the above-described operation to detect the <0>th data of the data lines DQ and bDQ and output them as the signals DQw<0> and bDQw<0>. When the clock signal Qclkb changes to "H", the second input receiver 24 operates to detect the <1>th data of the data lines DQ and bDQ and output them as signals DQw<1> and bDQw<1>. When the clock signal Iclk changes to "H", the third input receiver 25 operates to detect the <2>th data of the data lines DQ and bDQ and output them as signals DQw<2> and bDQw<2>. When the clock signal Qclk changes to "H", the fourth input receiver 26 operates to detect the <3>th data of the data lines DQ and bDQ and output them as signals DQw<3> and bDQw<3>. When the clock signal Iclkb changes to "H", the first input receiver 23 operates again to detect the <4>th data of the data lines DQ and bDQ and output them as the signals DQw<0> and bDQw<0>. By repeating this operation, 16-bit serial data is detected, and 4-bit (×4) serial data DQw<0:3> and bDQw<0:3> are output from the input receiving circuit 5. The output from the input receiving circuit 5 is converted into 16-bit parallel data by the input buffer circuit 6 and write shift register 7 and written in the memory core unit 2.

As described above, in writing data in the semiconductor memory device which executes the input/output operation in synchronism with the high-frequency clock, data must be output from the tester at a data rate of 4 Gbps (250 ps per bit). However, a tester capable of such a high-speed operation is expensive, and the cost of the test of the semiconductor memory device increases.

A semiconductor memory device according to an embodiment of the present invention which solves the above-described problems will be described below with reference to the accompanying drawing. In the following description, the same reference numerals denote the same parts throughout the drawing.

FIRST EMBODIMENT

A semiconductor memory device according to the first embodiment of the present invention will be described.

Figure 14:
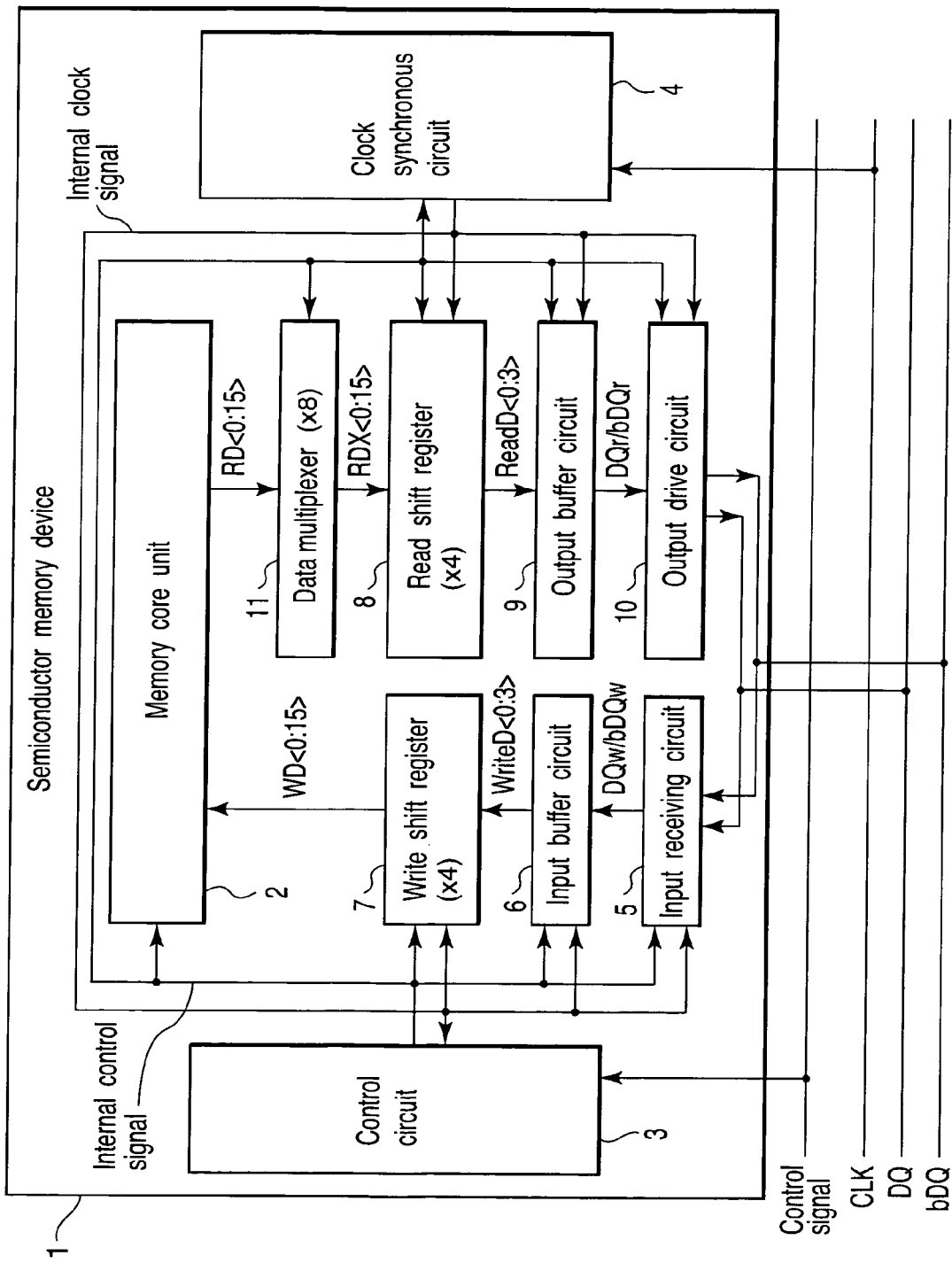
FIG. 14 is a block diagram showing the arrangement of a semiconductor memory device according to a first embodiment of the present invention.

FIG. 14 is a block diagram showing the arrangement of the semiconductor memory device according to the first embodiment. In the example shown in FIG. 2, the data RD<0:15> read out from the memory core unit 2 is directly input to the read shift register 8. In the first embodiment, the data is input to a read shift register 8 through a data multiplexer 11.

Figure 15:
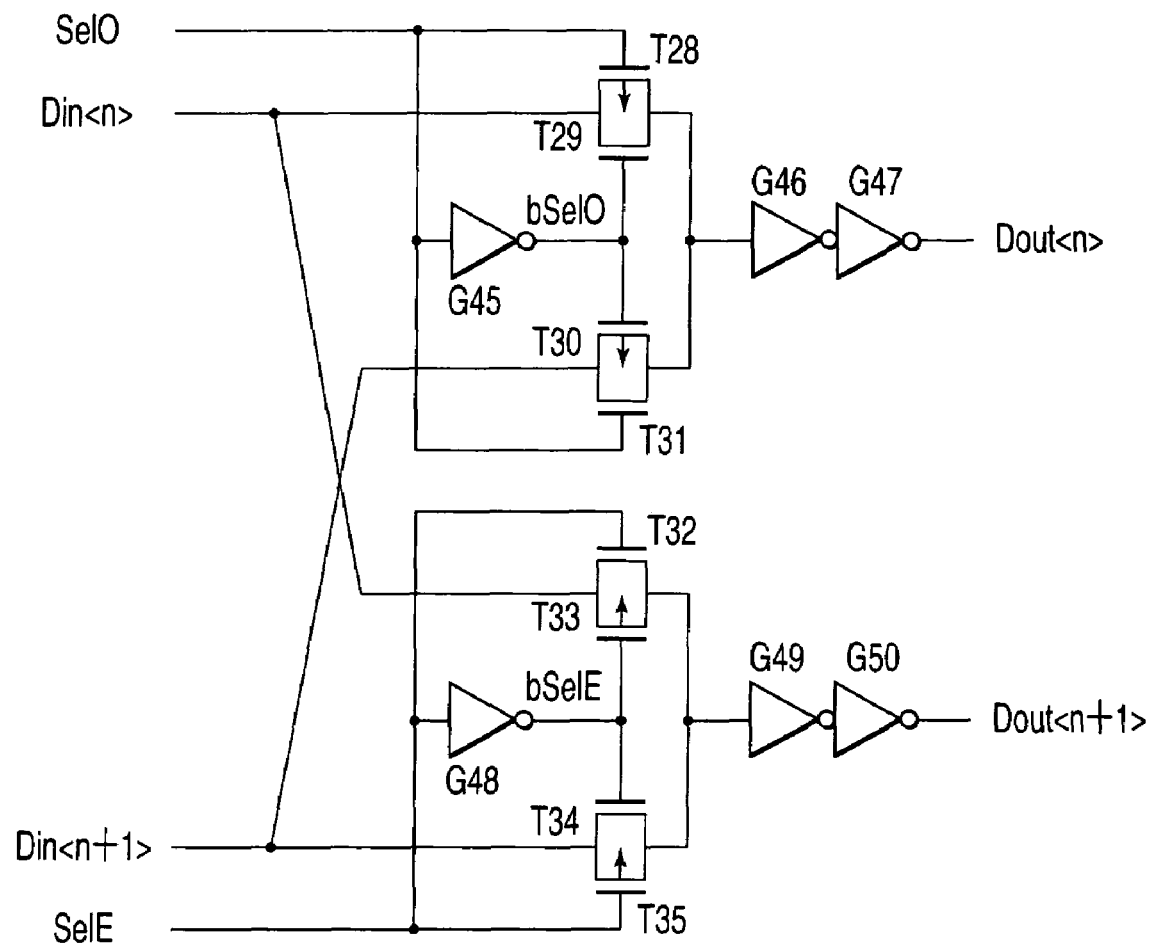
FIG. 15 is a circuit diagram showing the arrangement of a data multiplexer of the semiconductor memory device according to the first embodiment.

FIG. 15 is a circuit diagram showing the arrangement of the data multiplexer 11 of the semiconductor memory device according to the first embodiment. Of 16-bit parallel data RD<0:15> read out from a memory core unit 2, even- numbered data RD<n> (n=0, 2, 4, 6, 8, 10, 12, 14) is input, as a signal Din<n>, to the common source (or drain) of a PMOS transistor T28 and an NMOS transistor T29. An internal control signal SelO from a control circuit 3 is input to the gate of the transistor T28. A signal bSelO obtained by inverting the internal control signal SelO by an inverter G45 is input to the gate of the transistor T29. The signal Din<n> is also input to the common source (or drain) of an NMOS transistor T32 and a PMOS transistor T33. An internal control signal SelE is input to the gate of the transistor T32. A signal bSelE obtained by inverting the signal SelE by an inverter G48 is input to the gate of the transistor T33.

On the other hand, odd-numbered data RD<n+1> is connected, as a signal Din<n+1>, to the common source (or drain) of a PMOS transistor T30 and an NMOS transistor T31. The signal bSelO is input to the gate of the transistor T30. The signal SelO is input to the gate of the transistor T31. The signal Din<n+1> is also connected to the common source (or drain) of an NMOS transistor T34 and a PMOS transistor T35. The signal bSelE is input to the gate of the transistor T34. The signal SelE is input to the gate of the transistor T35.

The drains (or sources) of the transistors T28, T29, T30, and T31 are commonly connected to the input terminal of an inverter G46. The output from the inverter G46 is input to an inverter G47. The output from the inverter G47 is an output signal Dout<n> from the data multiplexer 11. The drains (or sources) of the transistors T32, T33, T34, and T35 are commonly connected to the input terminal of an inverter G49. The output from the inverter G49 is input to an inverter G50. The output from the inverter G50 is an output signal Dout<n+1> from the data multiplexer 11.

Figure 16:
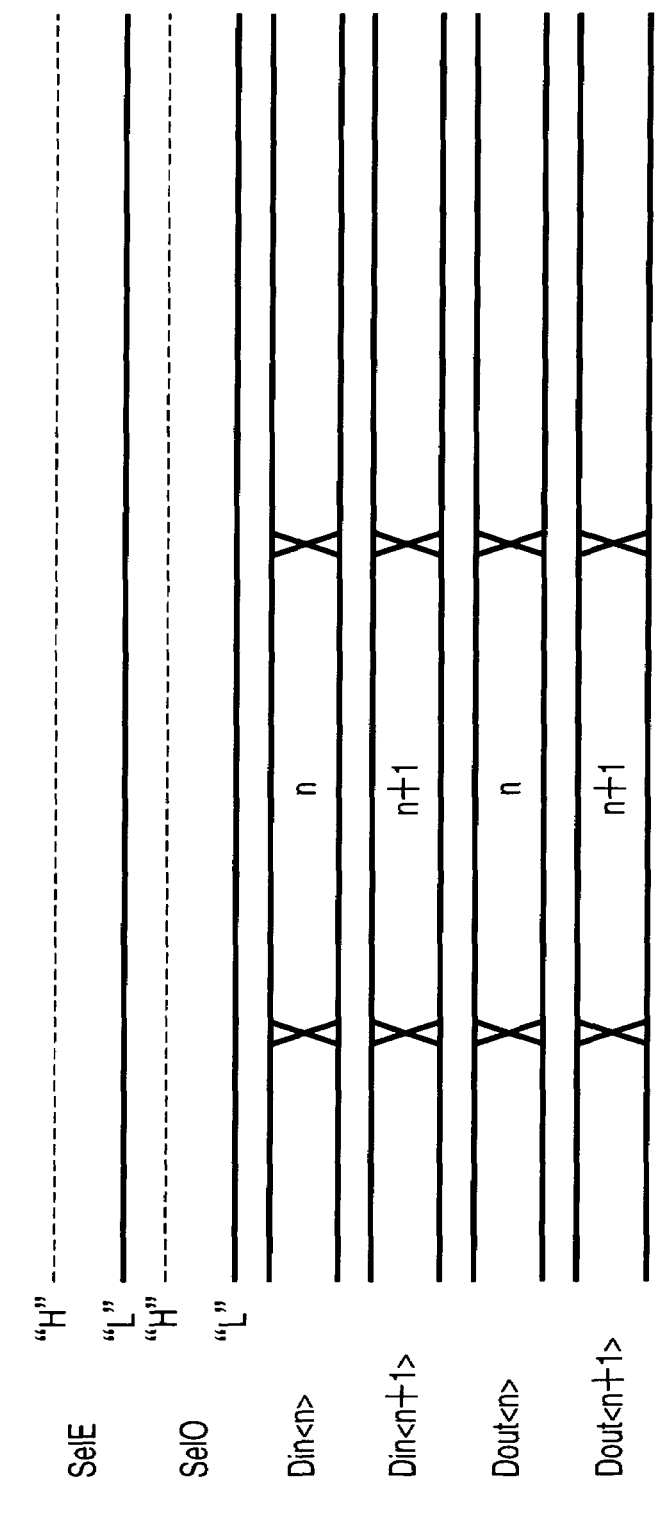
FIG. 16 is a timing chart showing voltage waveforms in the data multiplexer of the semiconductor memory device according to the first embodiment in the normal operation.
Figure 17:
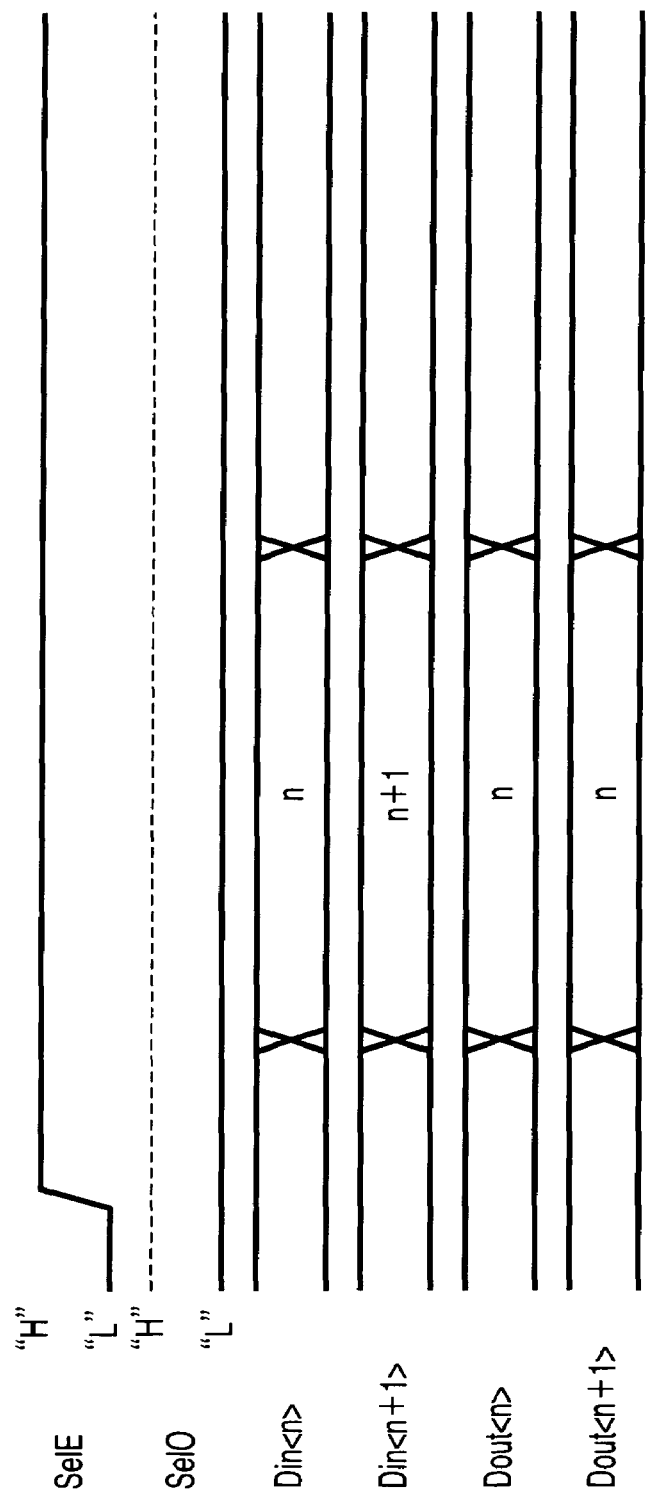
FIG. 17 is a timing chart showing voltage waveforms in the data multiplexer of the semiconductor memory device according to the first embodiment in outputting even-numbered data in a test.
Figure 18:
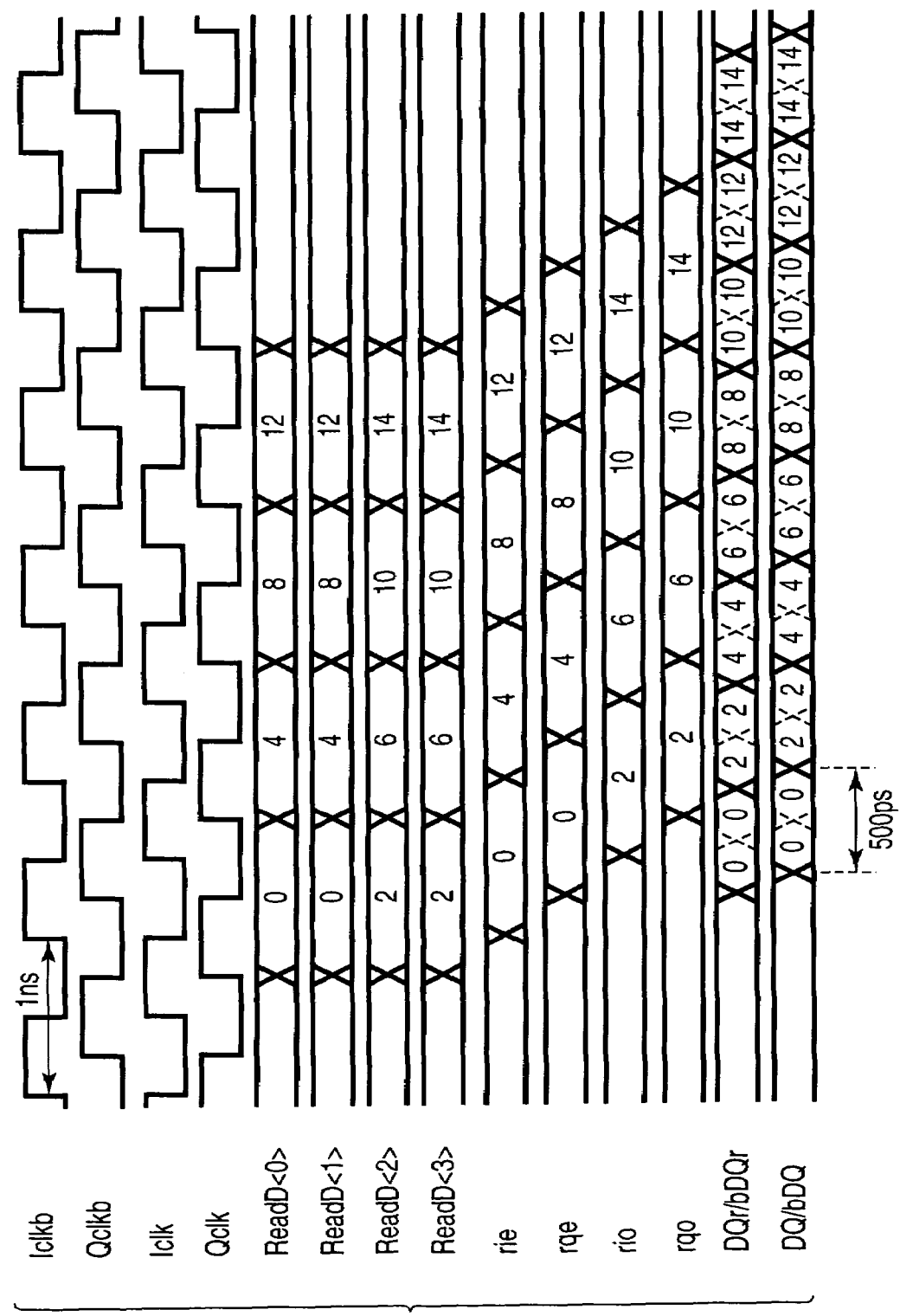
FIG. 18 is a timing chart showing voltage waveforms in the semiconductor memory device according to the first embodiment in outputting even-numbered data in a test.
Figure 19:
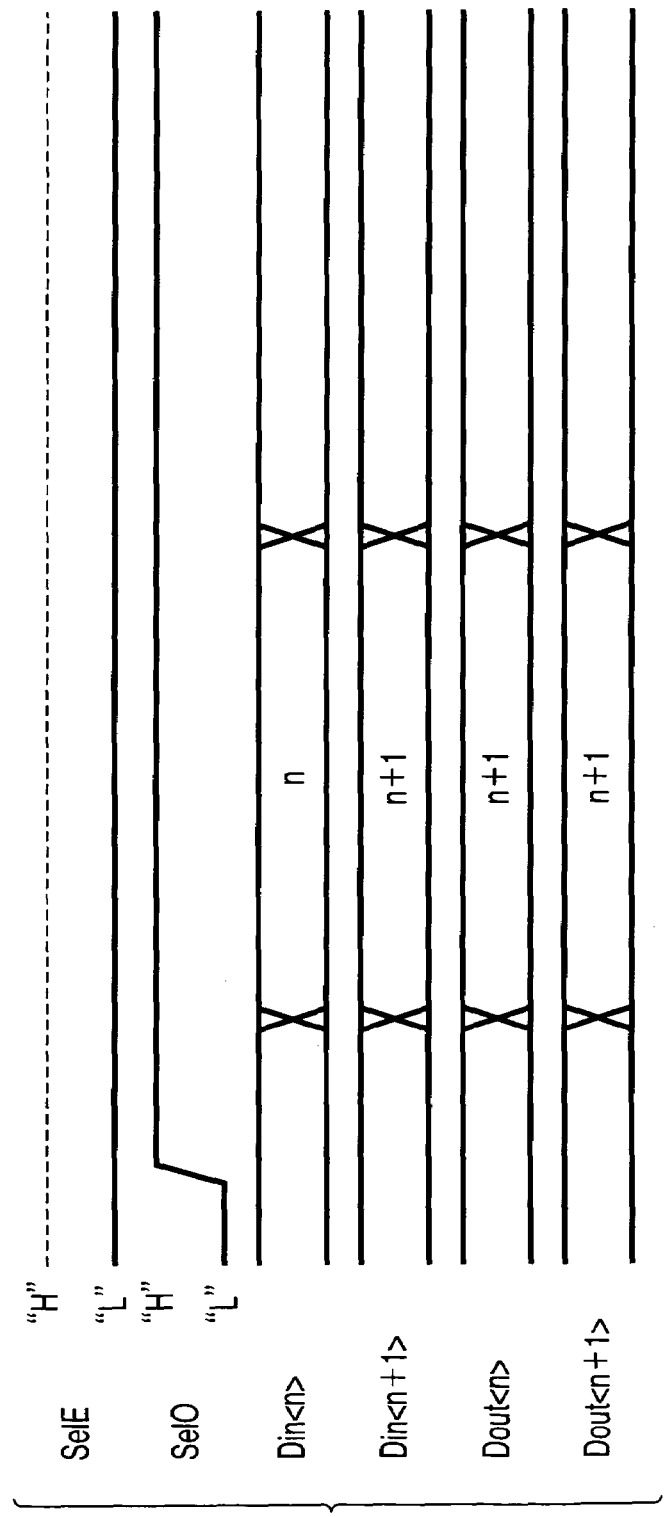
FIG. 19 is a timing chart showing voltage waveforms in the data multiplexer of the semiconductor memory device according to the first embodiment in outputting odd-numbered data in a test.
Figure 20:
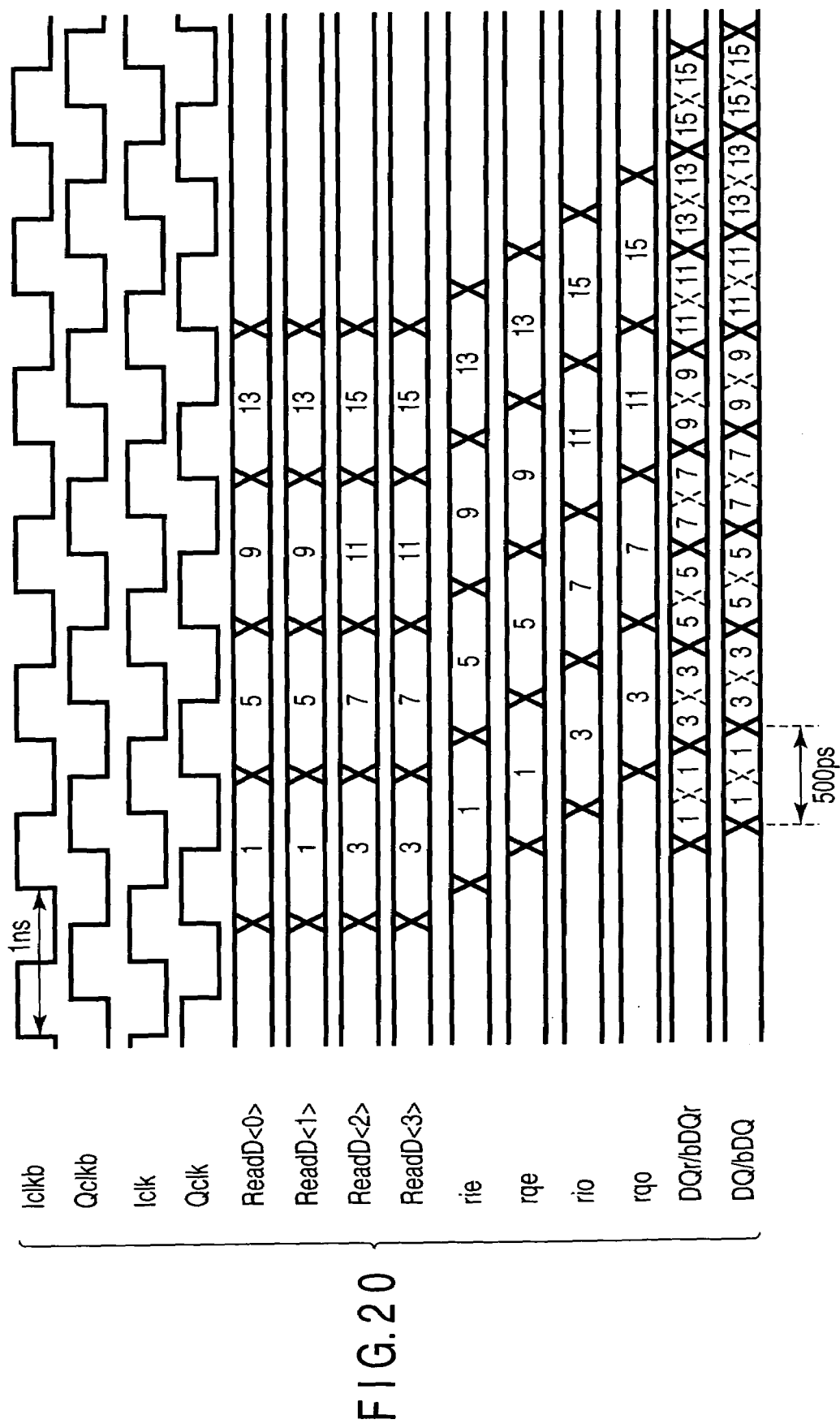
FIG. 20 is a timing chart showing voltage waveforms in the semiconductor memory device according to the first embodiment in outputting odd-numbered data in a test.

The operation of the data multiplexer 11 and the output operation of the semiconductor memory device will be described with reference to FIGS. 16 to 20. FIG. 16 shows the voltage waveforms of the parts of the data multiplexer in the normal operation. FIG. 17 shows the voltage waveforms of the parts of the data multiplexer in outputting even-numbered data in a test. FIG. 18 shows the voltage waveforms of the main parts of the semiconductor memory device in outputting even-numbered data in a test. FIG. 19 shows the voltage waveforms of the parts of the data multiplexer in outputting odd-numbered data in a test. FIG. 20 shows the voltage waveforms of the main parts of the semiconductor memory device in outputting odd-numbered data in a test.

The operation of the data multiplexer 11 in the normal operation will be described first with reference to FIG. 16. Both the internal control signals SelE and SelO always maintain "L" level. Hence, the transistors T28, T29, T34, and T35 are ON, and the transistors T30, T31, T32, and T33 are OFF. The signal Din<n> is input to the input terminal of the inverter G46. The signal Din<n+1> is input to the input terminal of the inverter G49. When data is read out from the memory core unit 2, the data of the signal Din<n> is directly output to the output signal Dout<n> through the inverters G46 and G47. The data of the signal Din<n+1> is directly output to the output signal Dout<n+1> through the inverters G49 and G50. That is, the 16-bit parallel data RD<0:15> read out from the memory core unit 2 is directly input to the read shift register 8 as parallel data RDX<0:15>.

The parallel data RDX<0:15> is converted into 16-bit serial data by the read shift register 8 and an output buffer circuit 9. The converted 16-bit serial data is output to external data lines DQ and bDQ by an output drive circuit 10 at a data rate of 4 Gbps (250 ps per bit), as in the example shown in FIG. 2.

The operation of each part of the data multiplexer 11 and semiconductor memory device in outputting even-numbered data in a test will be described with reference to FIGS. 17 and 18. Unlike the normal operation, the internal control signal SelE is changed to "H" before reading out data from the memory cell. On the other hand, the internal control signal SelO always remains "L". Hence, the transistors T28, T29, T32, and T33 are ON, and the transistors T30, T31, T34, and T35 are OFF. The signal Din<n> is input to the input terminals of the inverters G46 and G49. The signal Din<n+1> is disconnected. When data is read out from the memory core unit 2, the data of the signal Din<n> is directly output to the output signal Dout<n>. The data of the signal Din<n> is also output to the output signal Dout<n+1>.

An output signal Dout<0:15> is input to the read shift register 8 as 16-bit parallel data. At this time, as shown in FIG. 18, the same data as a signal ReadD<n> is output to an output signal ReadD<n+1> from the read shift register 8. The signal ReadD<n> is input to the output buffer circuit 9, and the same processing as in the example shown in FIG. 2 is executed. Hence, signals rie and rqe output the same even-numbered (0th, 4th, 8th, 12th) data. Signals rio and rqo also output the same even-numbered (2nd, 6th, 10th, 14th) data. Even-numbered data is continuously output as signals DQr and bDQr. The signals DQr and bDQr are input to the output drive circuit 10 and output to the pair of external data lines DQ and bDQ. Since the signals DQr and bDQr continuously output the even-numbered data, 8-bit serial data is output to the pair of external data lines DQ and bDQ at a data rate of 2 Gbps (500 ps per bit).

The operation of each part of the data multiplexer 11 and semiconductor memory device in outputting odd-numbered data will be described with reference to FIGS. 19 and 20. Unlike the normal operation, the internal control signal SelO is changed to "H" before reading out data from the memory cell. On the other hand, the internal control signal SelE always remains "L". Hence, the transistors T30, T31, T34, and T35 are ON, and the transistors T28, T29, T32, and T33 are OFF. The signal Din<n+1> is input to the input terminals of the inverters G46 and G49. The signal Din<n> is disconnected. When data is read out from the memory core unit 2, the data of the signal Din<n+1> is output to the output signal Dout<n>. The data of the signal Din<n+1> is also output to the output signal Dout<n+1>.

The output signal Dout<0:15> is input to the read shift register 8 as 16-bit parallel data. At this time, as shown in FIG. 20, the same data as the signal ReadD<n+1> is output to the signal ReadD<n> from the read shift register 8. The signal ReadD<n> is input to the output buffer circuit 9, and the same processing as in the example shown in FIG. 2 is executed. Hence, the signals rie and rqe output the same odd-numbered (1st, 5th, 9th, 13th) data. The signals rio and rqo also output the same odd-numbered (3rd, 7th, 11th, 15th) data. Odd-numbered data is continuously output as the signals DQr and bDQr. The signals DQr and bDQr are input to the output drive circuit 10 and output to the pair of external data lines DQ and bDQ. Since the signals DQr and bDQr continuously output the odd-numbered data, 8-bit serial data is output to the pair of external data lines DQ and bDQ at a data rate of 2 Gbps (500 ps per bit).

As described above, in the first embodiment, read data is output to the outside at a data rate of 4 Gbps in the normal operation. In a test, the read test of even-numbered data and the read test of odd-numbered data can be conducted at a data rate compressed to ½ (2 Gbps). Hence, in the semiconductor memory device of this embodiment, a high-speed input/output operation test can be done even by an inexpensive low-speed tester, and the cost of the test of the semiconductor memory device can be reduced. That is, according to the first embodiment, the data input/output operation in a test can be executed at a lower speed than the normal operation with little change in the data input/output operation in the normal operation. Since even an inexpensive tester capable of only a low-speed input/output operation can conduct a high-speed input/output operation test, the cost of the test of the semiconductor memory device can be reduced. Hence, an inexpensive semiconductor memory device can be implemented.

SECOND EMBODIMENT

A semiconductor memory device according to the second embodiment of the present invention will be described next. The same reference numerals as in the first embodiment denote the same parts in the second embodiment, and a description thereof will be omitted.

FIG. 21 is a block diagram showing the arrangement of the semiconductor memory device according to the second embodiment. In the first embodiment, the read data RD<0:15> from the memory core unit 2 is directly input to the data multiplexer 11. In the second embodiment, read data from a memory core unit 2 is input to a read shift register 8, and the output from the read shift register 8 is input to a data multiplexer 11. The arrangement of the remaining components is the same as in the first embodiment.

The arrangement of the data multiplexer 11 in FIG. 21 is the same as in the first embodiment except the input signal to the data multiplexer 11 is an output signal ReadD<n> (n=0, 1, 2, 3) from the read shift register 8, and the output from the data multiplexer 11 is input to an output buffer circuit 9. The operation of the data multiplexer 11 is the same as in the first embodiment, and a description thereof will be omitted.

Figure 22:
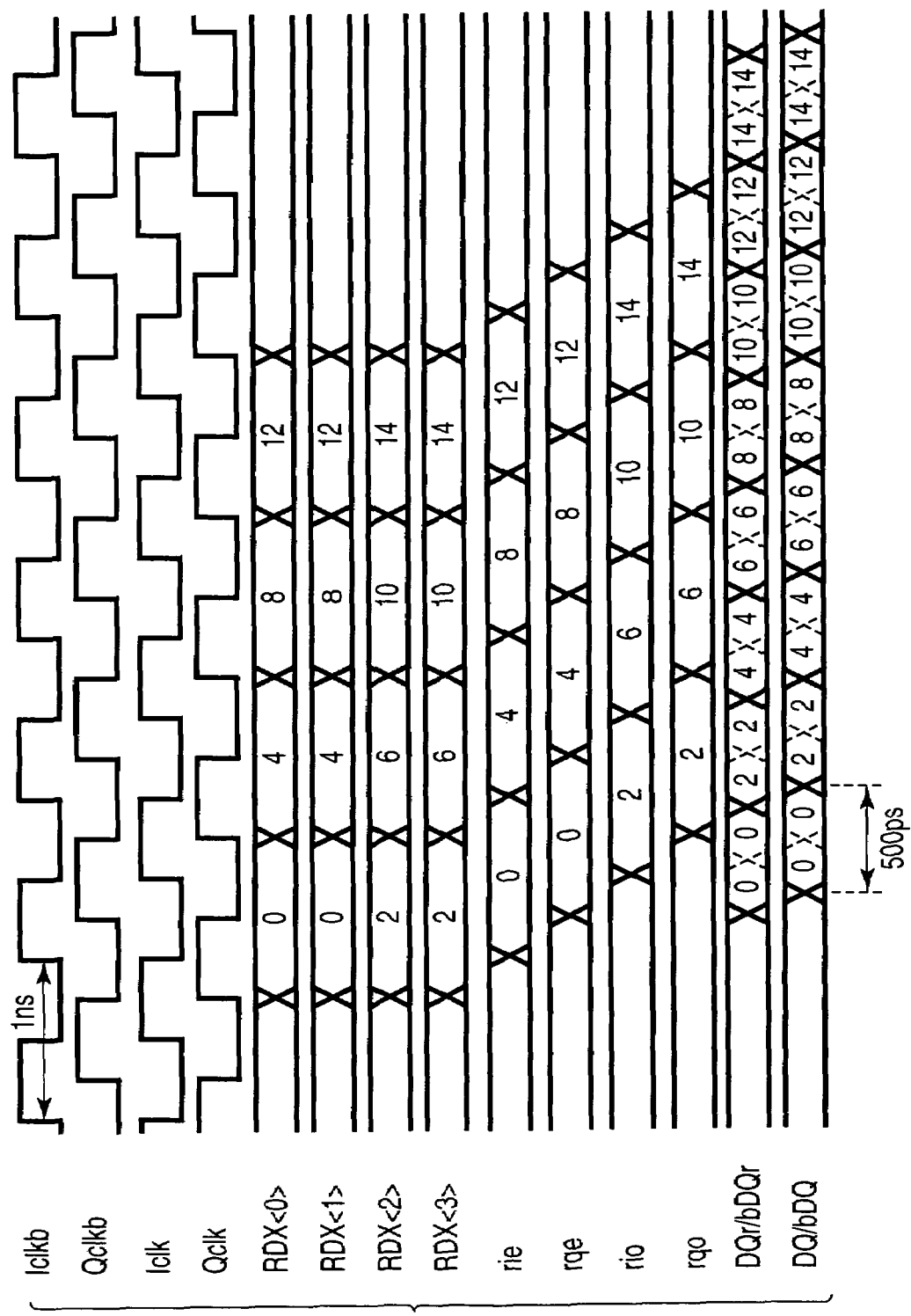
FIG. 22 is a timing chart showing voltage waveforms in the semiconductor memory device according to the second embodiment in outputting even-numbered data in a test.
Figure 23:
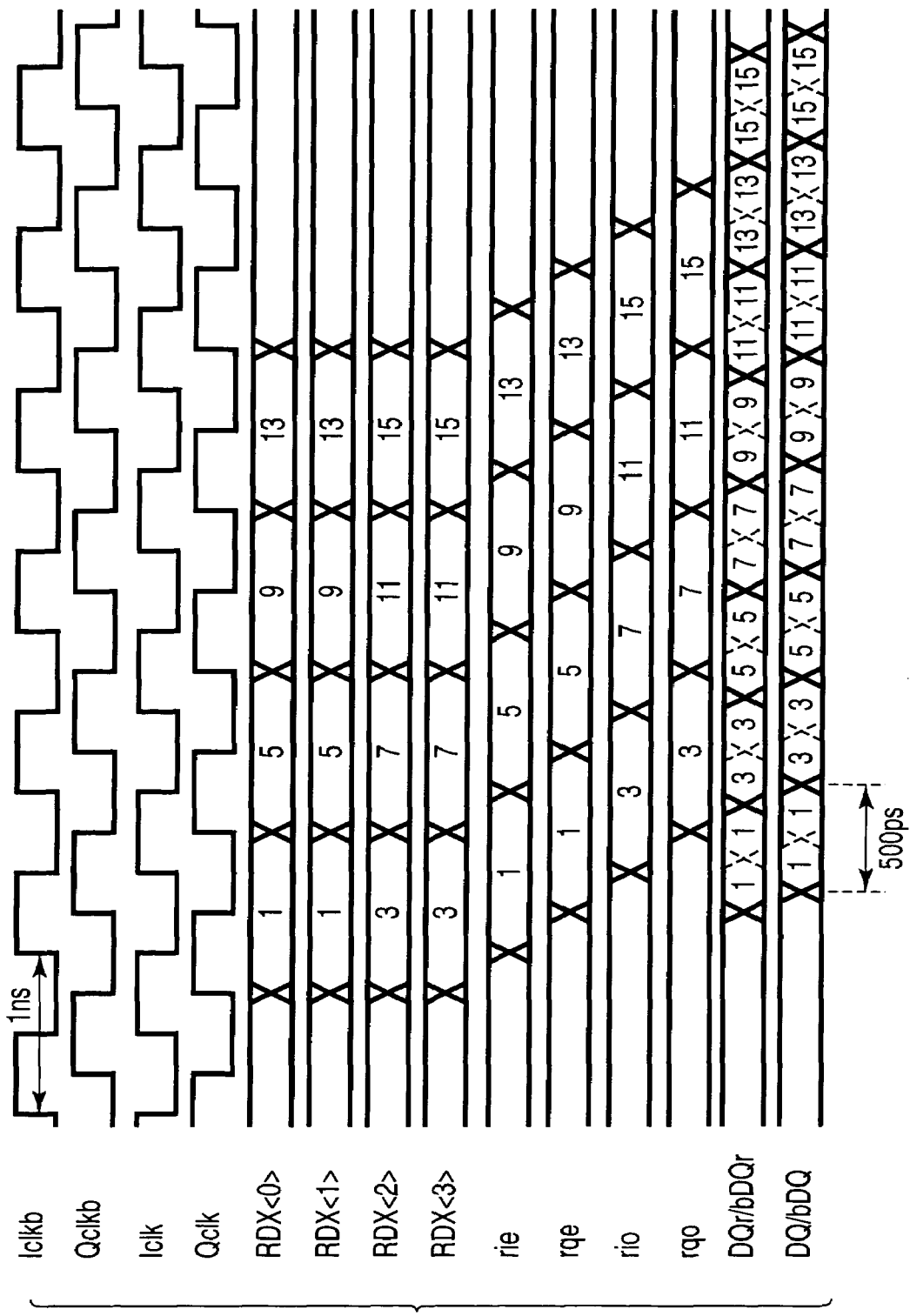
FIG. 23 is a timing chart showing voltage waveforms in the semiconductor memory device according to the second embodiment in outputting odd-numbered data in a test.

FIGS. 22 and 23 are timing charts showing the voltage waveforms of the main parts of the semiconductor memory device according to the second embodiment. FIG. 22 shows voltage waveforms in outputting even-numbered data in a test. FIG. 23 shows voltage waveforms in outputting odd-numbered data. Sixteen-bit parallel data RD<0:15> read out from the memory core unit 2 is input to the four read shift registers 8, and 4-bit (×4) serial data ReadD<0:3> is output, as in the example shown in FIG. 2. In the second embodiment, two data multiplexers 11 are present. Of the signal ReadD<0:3>, a signal ReadD<0,1> is input to the first data multiplexer, and a signal ReadD<2,3> is input to the second data multiplexer. These data multiplexers perform the same operation as in the first embodiment.

In outputting even-numbered data, an internal control signal SelE is set to "H", and a signal SelO is set to "L". The first data multiplexer outputs even-numbered (0th, 4th, 8th, 12th) data simultaneously to signals RDX<0> and RDX<1> as serial data. The second data multiplexer outputs even-numbered (2nd, 6th, 10th, 14th) data simultaneously to signals RDX<2> and RDX<3> as serial data. A signal RDX<0:3> is input to the output buffer circuit 9 and output from the output buffer circuit 9 at a data rate of 2 Gbps (500 ps per bit) as 8-bit serial data, as in the example shown in FIG. 22 and the first embodiment. Output signals DQr and bDQr from the output buffer circuit 9 are input to an output drive circuit 10 and output to a pair of external data lines DQ and bDQ. Hence, 8-bit serial data is output to the pair of external data lines DQ and bDQ at a data rate of 2 Gbps (500 ps per bit).

In outputting odd-numbered data, the internal control signal SelE is set to "L", and the signal SelO is set to "H". The first data multiplexer outputs odd-numbered (1st, 5th, 9th, 13th) data simultaneously to the signals RDX<0> and RDX<1> as serial data. The second data multiplexer outputs odd-numbered (3rd, 7th, 11th, 15th) data simultaneously to the signals RDX<2> and RDX<3> as serial data. The output buffer circuit 9 and output drive circuit 10 operate as in outputting odd-numbered data so that 8-bit serial data is output to the pair of external data lines DQ and bDQ at a data rate of 2 Gbps (500 ps per bit).

As described above, according to the second embodiment, read data is output to the outside at a data rate of 4 Gbps in the normal operation. In a test, the read test of even-numbered data and the read test of odd-numbered data can be conducted at a data rate compressed to ½ (2 Gbps), as in the first embodiment. Hence, in the semiconductor memory device of this embodiment, a high-speed input/output operation test can be done even by an inexpensive low-speed tester, and the cost of the test of the semiconductor memory device can be reduced.

THIRD EMBODIMENT

A semiconductor memory device according to the third embodiment of the present invention will be described next. The same reference numerals as in the first embodiment denote the same parts in the third embodiment, and a description thereof will be omitted.

Figure 24:
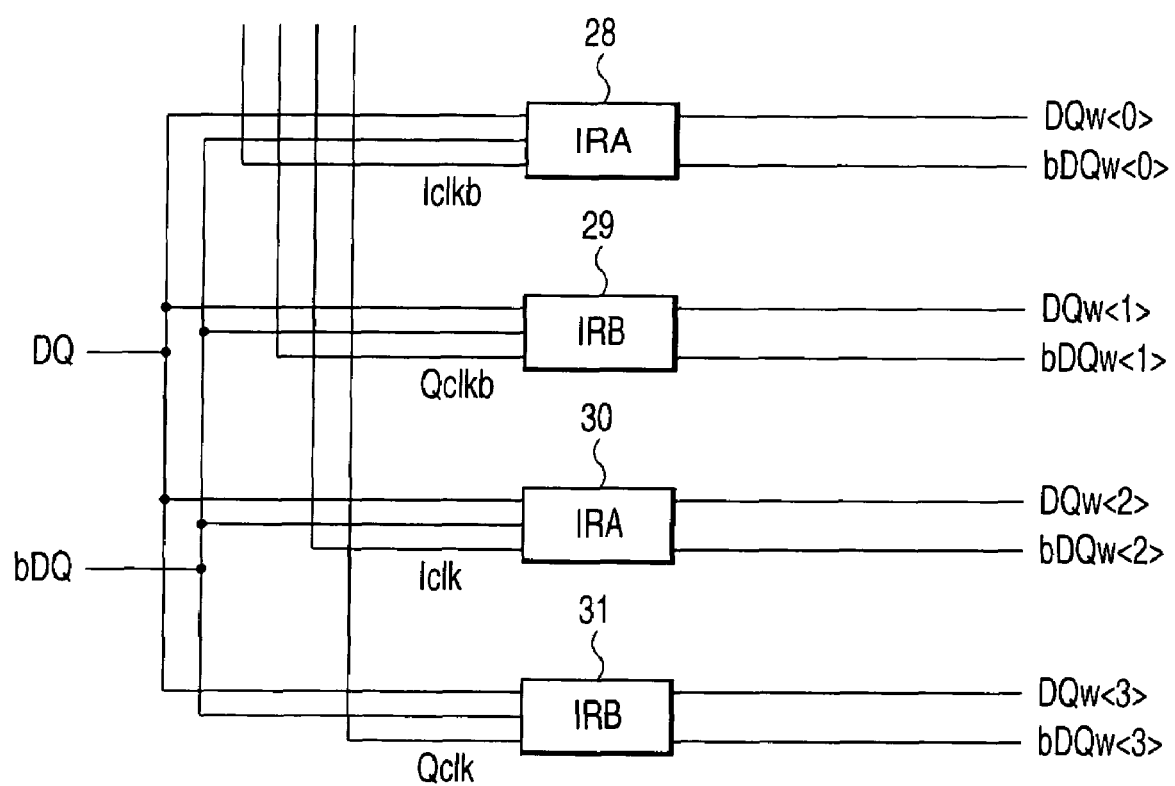
FIG. 24 is a circuit diagram showing the arrangement of an input receiving circuit in a semiconductor memory device according to a third embodiment of the present invention.

FIG. 24 is a circuit diagram showing the arrangement of an input receiving circuit in the semiconductor memory device according to the third embodiment. In the example shown in FIG. 2, four input receivers (IR) in the input receiving circuit 5 use the same circuit. In the third embodiment, the input receiving circuit has input receivers (IRA) 28 and 30 and input receivers (IRB) 29 and 31. The input receivers (IRA) 28 and 30 have a circuit arrangement different from that of the input receivers (IRB) 29 and 31. The input receiver (IRA) 28 receives even-numbered (0th, 4th, 8th, 12th) data transmitted to a pair of external data lines DQ and bDQ and output it as signals DQw<0> and bDQw<0>. The input receiver (IRB) 29 receives odd-numbered (1st, 5th, 9th, 13th) data transmitted to the pair of external data lines DQ and bDQ and output it as signals DQw<1> and bDQw<1>. The input receiver (IRA) 30 receives even-numbered (2nd, 6th, 10th, 14th) data transmitted to the pair of external data lines DQ and bDQ and output it as signals DQw<2> and bDQw<2>. The input receiver (IRB) 31 receives odd-numbered (3rd, 7th, 11th, 15th) data transmitted to the pair of external data lines DQ and bDQ and output it as signals DQw<3> and bDQw<3>. The arrangement of the remaining components is the same as in the first or second embodiment.

Figure 25:
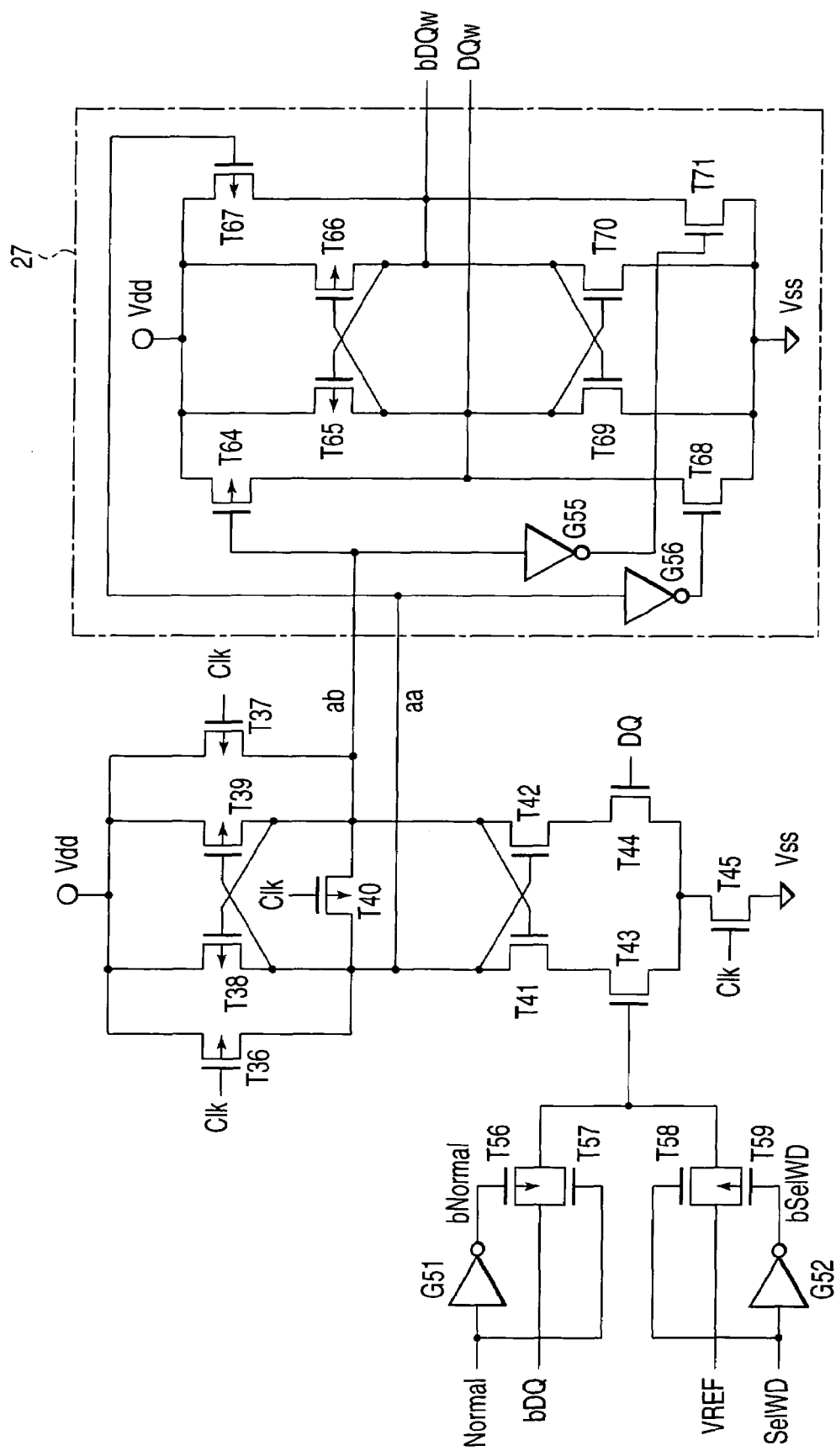
FIG. 25 is a circuit diagram of an input receiver (IRA) in the input receiving circuit of the semiconductor memory device according to the third embodiment.

FIG. 25 shows the detailed circuit arrangement of the input receiver (IRA) to output the even-numbered signals DQw and bDQw. The circuit arrangement of the gate input portion of an NMOS transistor T43 in FIG. 25 and the circuit arrangement of the gate input portion of an NMOS transistor T44 in FIG. 26 are different from the example shown in FIG. 12.

The input receivers (IRA) 28 and 30 shown in FIG. 25 have the following arrangement. A signal Clk in FIG. 25 indicates one of clock signals Iclk and Iclkb. The external data line bDQ is connected to the common source (or drain) of a PMOS transistor T56 and an NMOS transistor T57. A signal bNormal obtained by inverting an internal control signal Normal from a control circuit 3 by an inverter G51 is input to the gate of the transistor T56. The signal Normal is input to the gate of the transistor T57. A reference potential VREF applied from the outside of generated in an internal circuit is input to the common source (or drain) of an NMOS transistor T58 and a PMOS transistor T59. An internal control signal SelWD from the control circuit 3 is input to the gate of the transistor T58. A signal bSelWD obtained by inverting the signal SelWD by an inverter G52 is input to the gate of the transistor T59. The drains (or sources) of the transistors T56, T57, T58, and T59 are commonly connected to the gate of the NMOS transistor T43. The arrangement of the remaining components is the same as in FIG. 12.

Figure 26:
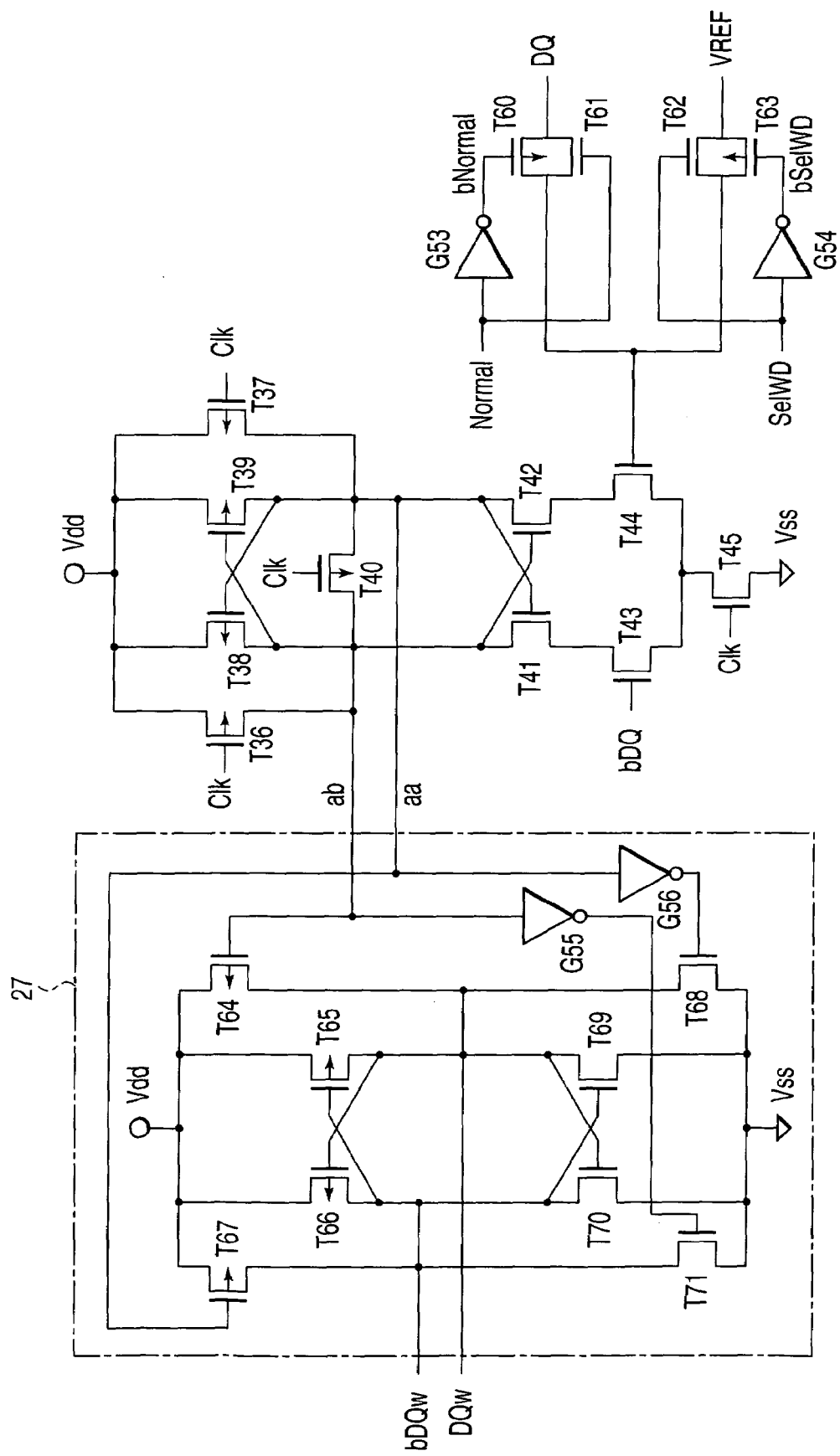
FIG. 26 is a circuit diagram of an input receiver (IRB) in the input receiving circuit of the semiconductor memory device according to the third embodiment.

The input receivers (IRB) 29 and 31 shown in FIG. 26 have the following arrangement. The signal Clk in FIG. 26 indicates one of clock signals Qclk and Qclkb. The external data line DQ is connected to the common source (or drain) of a PMOS transistor T60 and an NMOS transistor T61. The signal bNormal obtained by inverting the internal control signal Normal from the control circuit 3 by an inverter G53 is input to the gate of the transistor T60. The signal Normal is input to the gate of the transistor T61. The reference potential VREF is input to the common source (or drain) of an NMOS transistor T62 and a PMOS transistor T63. The internal control signal SelWD from the control circuit 3 is input to the gate of the transistor T62. The signal bSelWD obtained by inverting the signal SelWD by an inverter G54 is input to the gate of the transistor T63. The drains (or sources) of the transistors T60, T61, T62, and T63 are commonly connected to the gate of the NMOS transistor T44. The arrangement of the remaining components is the same as in FIG. 12.

Figure 27:
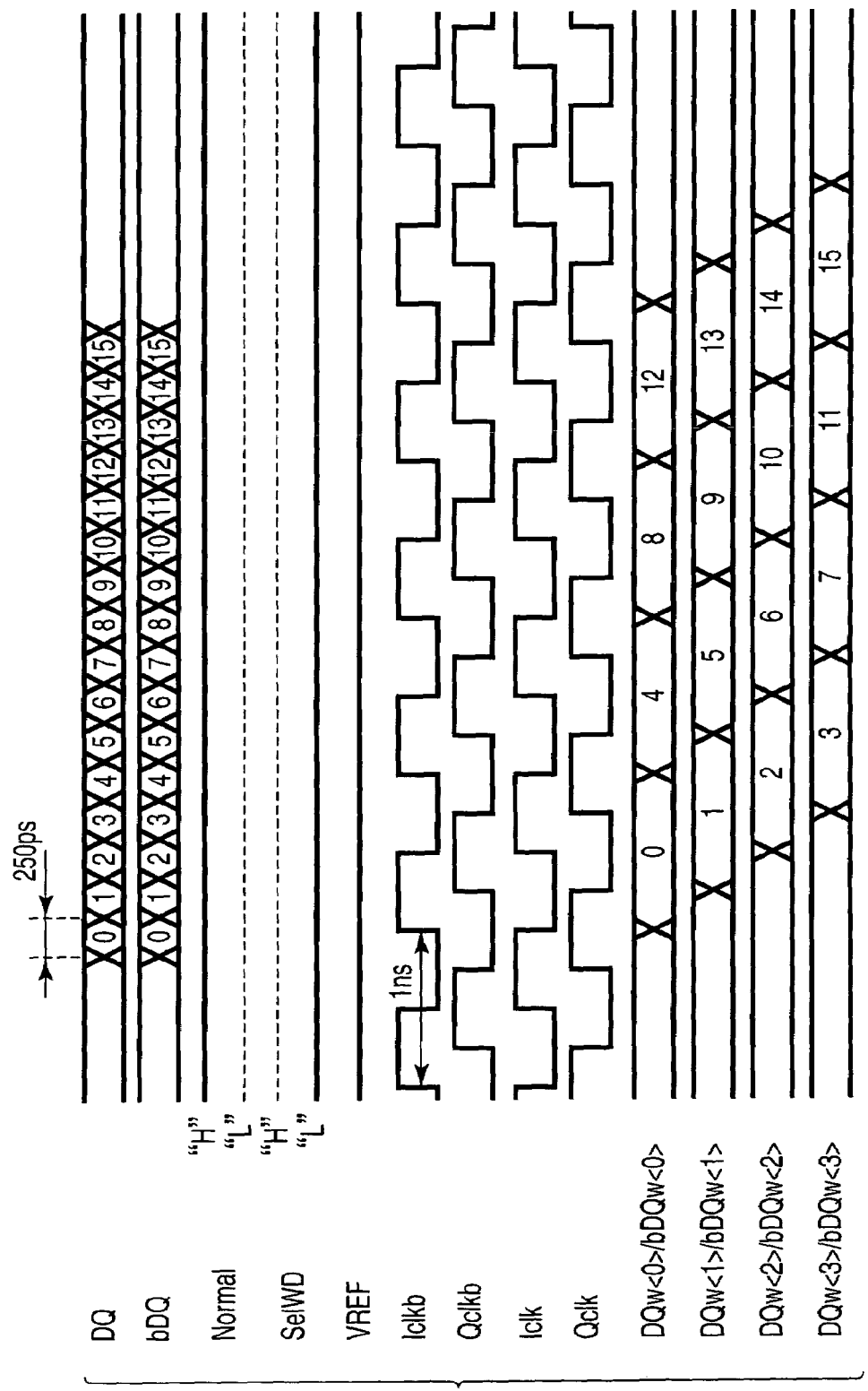
FIG. 27 is a timing chart showing voltage waveforms in the input receiving circuit of the semiconductor memory device according to the third embodiment in the normal operation.
Figure 28:
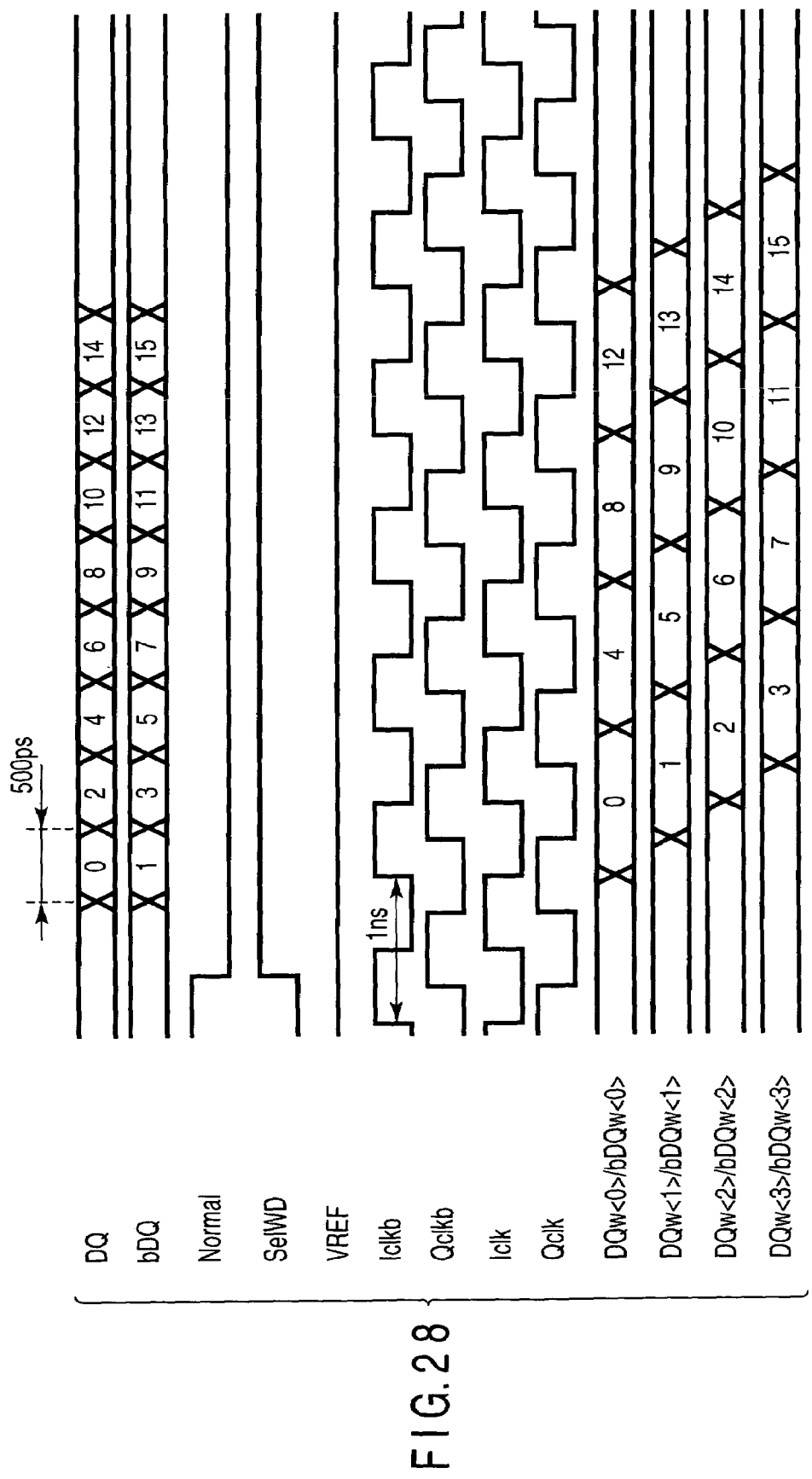
FIG. 28 is a timing chart showing voltage waveforms in the input receiving circuit of the semiconductor memory device according to the third embodiment in a test.

FIGS. 27 and 28 are timing charts showing the voltage waveforms of the parts of the input receiving circuit according to the third embodiment. FIG. 27 shows voltage waveforms in the normal operation. FIG. 28 shows voltage waveforms when the write data transmission rate is compressed to ½ in testing the semiconductor memory device.

In the normal operation shown in FIG. 27, the control signal Normal always remains "H", and the control signal SelWD always remains "L". Hence, the transistors T56 and T57 are ON, and the external data line bDQ is connected to the gate of the transistor T43 in FIG. 25. Since the transistors T58 and T59 are OFF, the reference potential VREF is disconnected from the gate of the transistor T43.

The transistors T60 and T61 are ON, and the external data line DQ is connected to the gate of the transistor T44 in FIG. 26. Since the transistors T62 and T63 are OFF, the reference potential VREF is disconnected from the gate of the transistor T44. In the state shown in FIG. 27, the same circuit operation as in the state shown in FIG. 13 is executed. That is, 16-bit serial data transmitted to the pair of external data lines DQ and bDQ at a data rate of 4 Gbps is detected by the four input receiving circuits 28 to 31 and output as signals DQw/bDQw<0:3>.

In the test shown in FIG. 28, before detecting the data of the pair of external data lines DQ and bDQ, the control signal Normal changes from "H" to "L", and the control signal SelWD changes from "L" to "H". Hence, the transistors T58 and T59 are ON, and the reference potential VREF is input to the gate of the transistor T43 in FIG. 25. On the other hand, since the transistors T56 and T57 are OFF, the external data line bDQ is disconnected from the gate of the transistor T43.

The transistors T62 and T63 are ON, and the reference potential VREF is input to the gate of the transistor T44 in FIG. 26. On the other hand, since the transistors T60 and T61 are OFF, the external data line DQ is disconnected from the gate of the transistor T44. In the normal operation, each of the input receivers (IRA) and input receivers (IRB) compares the potentials of the pair of data lines DQ and bDQ and detects and amplifies the data. In the test, each input receiver (IRA) compares the reference potential VREF with the potential of the data line DQ. Each input receiver (IRB) compares the reference potential VREF with the potential of the data line bDQ. Then, each of the input receivers detects and amplifies the data.

When the signal Iclkb changes to "H", the transistors T36, T37, and T40 of the first input receiver (IRA) 28 are turned off, and the transistor T45 is turned on. If the potential of the data line DQ is higher than the reference potential VREF, the transistors T42 and T44 are turned on to output "L" to a signal ab. In addition, the transistor T38 is turned on to output "H" to a signal aa. The signals aa and ab are input to a latch circuit 27. The latch circuit 27 outputs "H" to the signal DQw<0> and "L" to the signal bDQw<0>. Conversely, if the potential of the data line DQ is lower than the reference potential VREF, the transistors T41 and T43 are turned on to output "L" to the signal aa. In addition, the transistor T39 is turned on to output "H" to the signal ab. The signals aa and ab are input to the latch circuit 27. The latch circuit 27 outputs "L" to the signal DQW<0> and "H" to the signal bDQw<0>.

When the signal Qclkb changes to "H", the transistors T36, T37, and T40 of the second input receiver (IRB) 29 are turned off, and the transistor T45 is turned on. If the potential of the data line bDQ is higher than the reference potential VREF, the transistors T41 and T43 are turned on to output "L" to the signal ab. In addition, the transistor T39 is turned on to output "H" to the signal aa. The signals aa and ab are input to the latch circuit 27. The latch circuit 27 outputs "H" to the signal DQw<1> and "L" to the signal bDQw<1>. Conversely, if the potential of the data line bDQ is lower than the reference potential VREF, the transistors T42 and T44 are turned on to output "L" to the signal aa. In addition, the transistor T38 is turned on to output "H" to the signal ab. The signals aa and ab are input to the latch circuit 27. The latch circuit 27 outputs "L" to the signal DQw<1> and "H" to the signal bDQw<1>.

When the signal Iclk changes to "H", the third input receiver (IRA) 30 operates to detect the potential of the data line DQ and output the signals DQw<2> and bDQw<2>, like the above-described first input receiver (IRA) 28. When the signal Qclk changes to "H", the fourth input receiver (IRB) 31 operates to detect the potential of the data line bDQ and output the signals DQw<3> and bDQw<3>, like the above-described second input receiver (IRB) 29. When the signal Iclkb changes to "H", the first input receiver (IRA) 28 operates again to detect the potential of the data line DQ and output the signals DQW<0> and bDQw<0>. By repeating the operation, input data from the pair of external data lines DQ and bDQ are detected and output as the signals DQw/bDQw<0:3>.

As described above, according to the third embodiment, the operation is not changed at all in the normal operation. In a test, the data of the pair of external data lines DQ and bDQ are detected by causing the first and third input receivers to compare the potential of the data line DQ with the reference potential VREF and causing the second and fourth input receivers to compare the potential of the data line bDQ with the reference potential VREF. Hence, the input data rate of 4 Gbps (250 ps per bit) in the normal operation can be compressed to ½, i.e., 2 Gbps (500 ps per bit) in the test. Hence, in the semiconductor memory device of this embodiment, a high-speed input/output operation test can be done even by an inexpensive low-speed tester, and the cost of the test of the semiconductor memory device can be reduced.

Fourth Embodiment

A semiconductor memory device according to the fourth embodiment of the present invention will be described next. The same reference numerals as in the first embodiment denote the same parts in the fourth embodiment, and a description thereof will be omitted.

Figure 29:
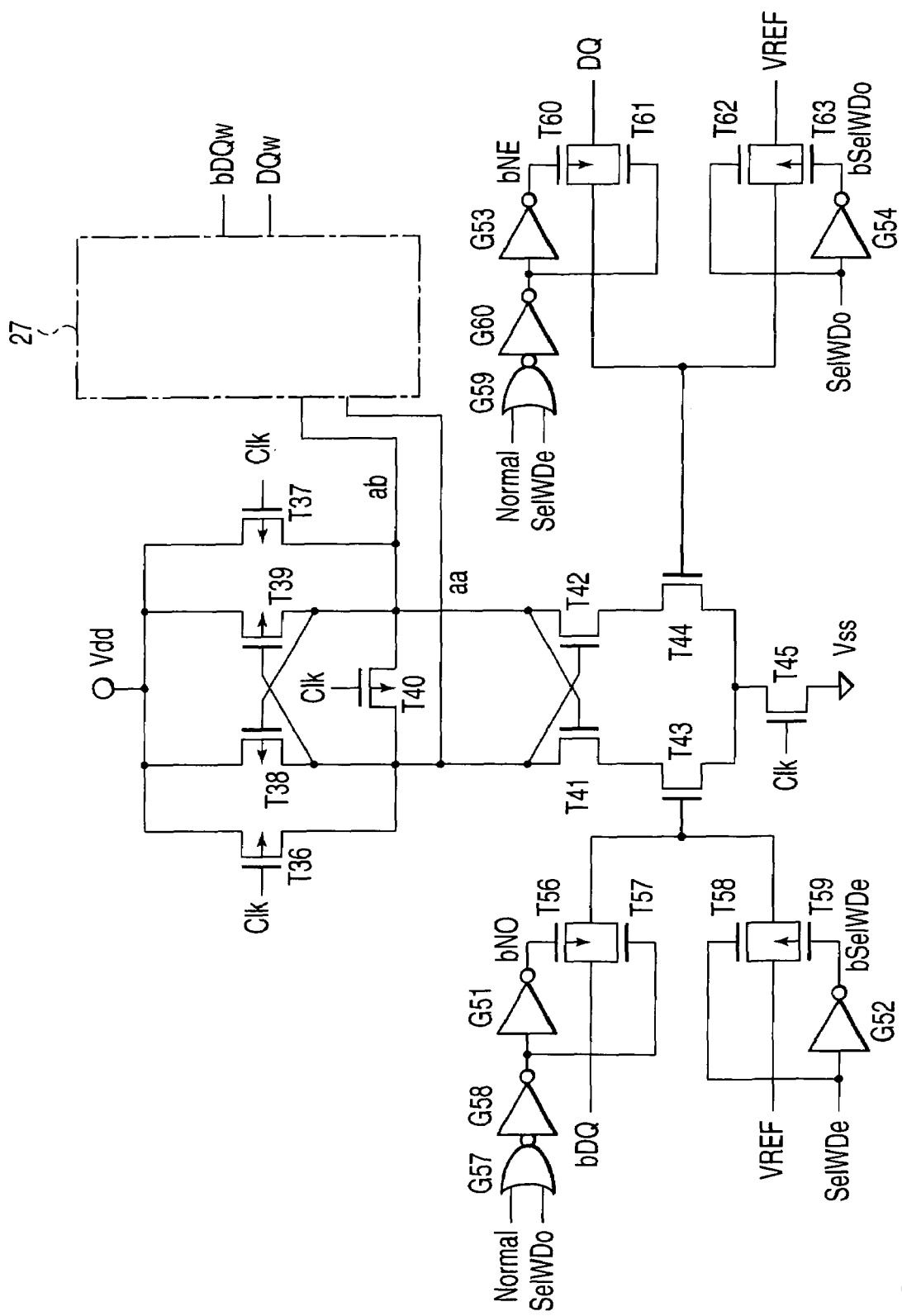
FIG. 29 is a circuit diagram of an input receiver (IRA) in an input receiving circuit of a semiconductor memory device according to a fourth embodiment of the present invention.
Figure 30:
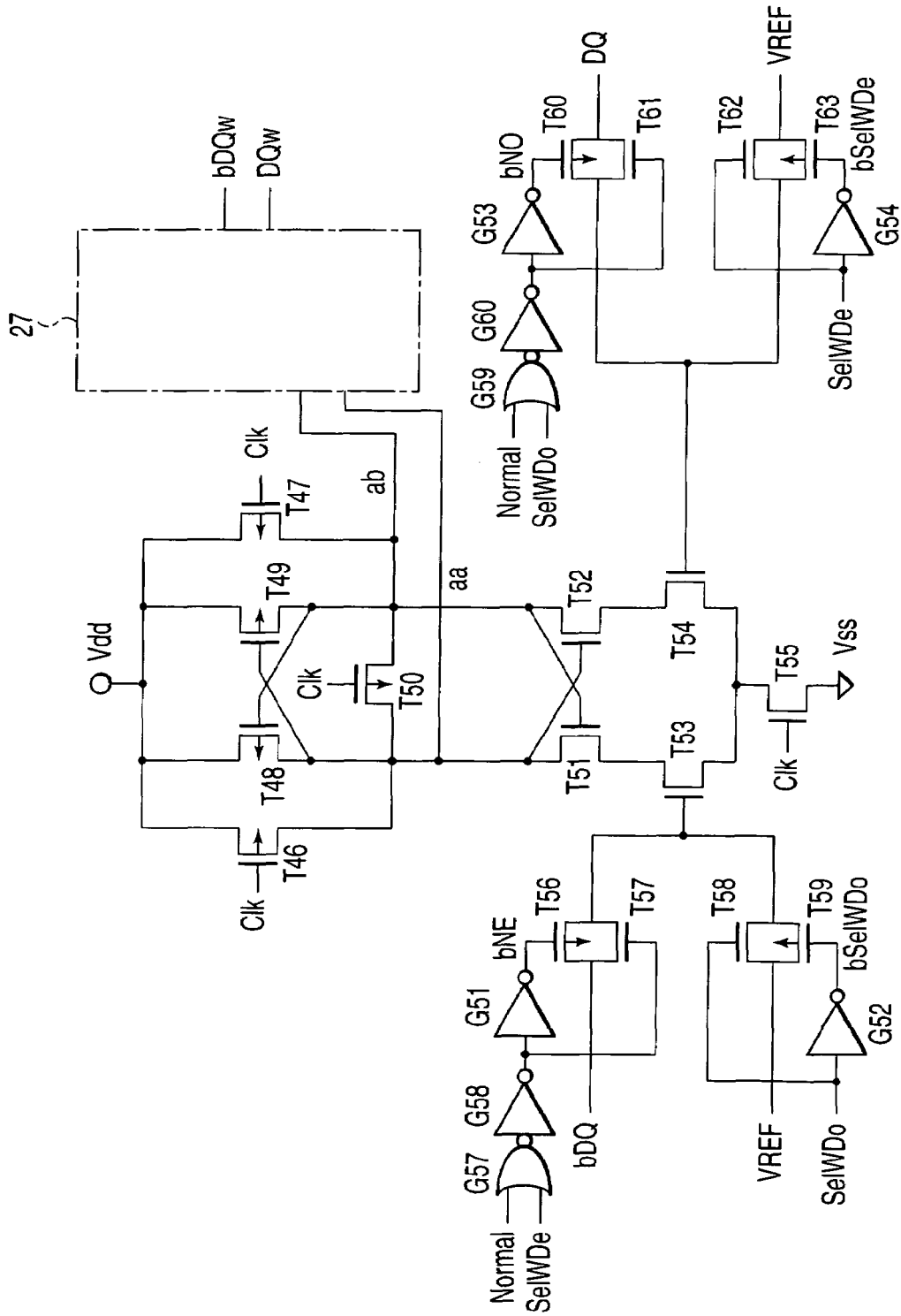
FIG. 30 is a circuit diagram of an input receiver (IRB) in the input receiving circuit of the semiconductor memory device according to the fourth embodiment.

FIGS. 29 and 30 are circuit diagrams showing the arrangement of an input receiving circuit of the memory device according to the fourth embodiment. FIG. 29 shows an input receiver (IRA) to output even-numbered signals DQw and bDQw. FIG. 30 shows an input receiver (IRB) to output odd-numbered signals DQw and bDQw. The fourth embodiment is the same as the third embodiment except the circuit arrangement of the gate input portions of transistors T43 and T44 in the input receivers (IRA) and input receivers (IRB). The input receiver (IRA) and input receiver (IRB) of the fourth embodiment are different only in that, of input signals to inverters G52, G54, G57, and G59, signals SelWDe and SelWDo are replaced with each other. A signal Clk in FIGS. 29 and 30 indicates one of clock signals Iclk, Qclk, Iclkb, and Qclkb.

The operation of the fourth embodiment is the same as in the third embodiment. In the fourth embodiment, therefore, the input data rate of 4 Gbps (250 ps per bit) in the normal operation can be compressed to ½, i.e., 2 Gbps (500 ps per bit) in a test. Hence, in the semiconductor memory device of this embodiment, a high-speed input/output operation test can be done even by an inexpensive low-speed tester, and the cost of the test of the semiconductor memory device can be reduced.

Figure 31:
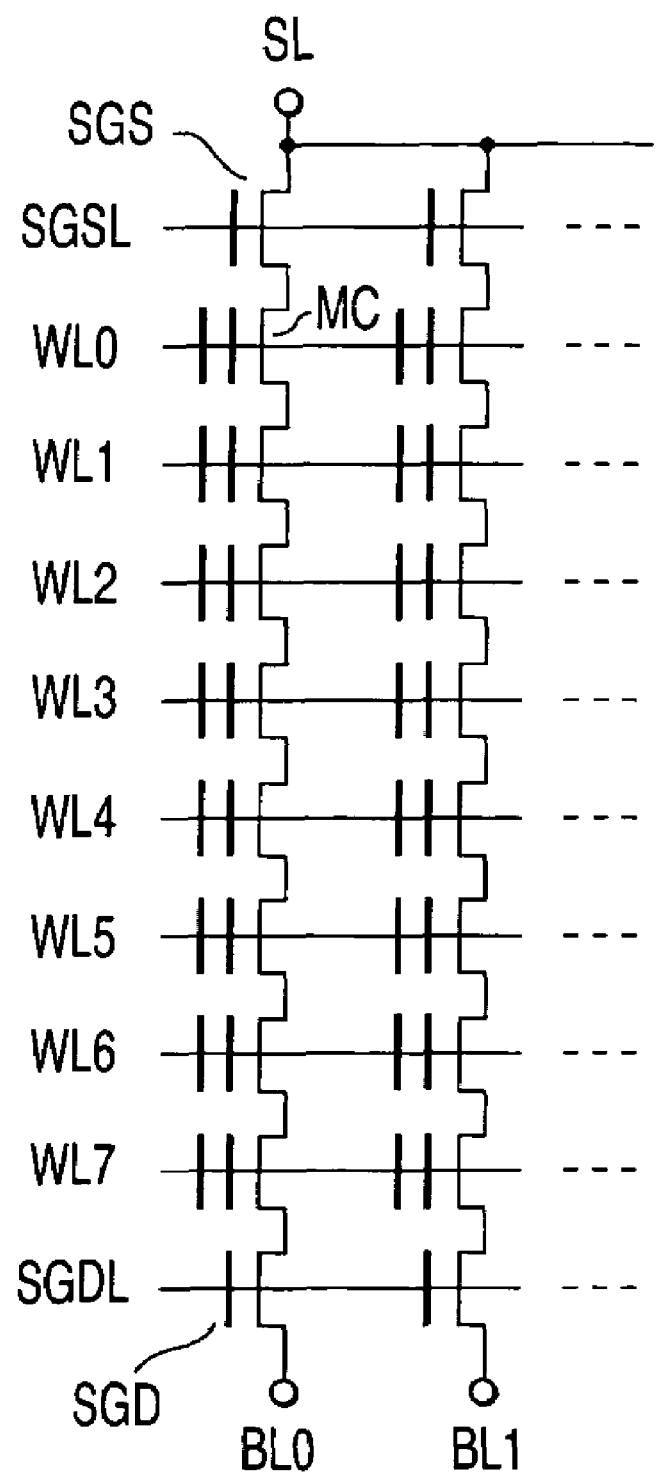
FIG. 31 is a circuit diagram showing a NAND memory cell structure serving as a memory core unit provided in the semiconductor memory devices according to the first to fourth embodiments.

As the memory core unit 2 provided in the semiconductor memory devices according to the above-described first to fourth embodiments, various memory cell structures such as a NAND or NOR nonvolatile memory and a dynamic random access memory (DRAM) can be used. For example, FIG. 31 is a circuit diagram showing a NAND memory cell structure. The NAND memory cell structure includes a plurality of memory cell units. A memory cell unit includes a memory cell group, first select gate transistor SGD, and second select gate transistor SGS. In the memory cell group, a plurality of memory cells MC each having a control gate and a floating gate are connected in series such that adjacent memory cells share the source and drain. The first select gate transistor SGD is connected between a bit line BL0 and one terminal of the memory cell group. The second select gate transistor SGS is connected between a source line SL and the other terminal of the memory cell group. Word lines WL0, WL1, . . . , WL7 are connected to the control gates of the memory cells MC. A select gate line SGDL is connected to the gate of the first select gate transistor SGD. A select gate line SGSL is connected to the gate of the second select gate transistor SGS.

According to the embodiment of the present invention, a semiconductor memory device can be provided, which is capable of causing even an inexpensive tester with a lower input/output operation speed than the data input/output operation speed of the semiconductor memory device to conduct the input/output operation test and reducing the test cost.

Each of the above-described embodiments can independently be practiced. However, they may appropriately be combined. The above-described embodiments incorporate inventions of various stages, and the inventions of various stages can be extracted by appropriately combining a plurality of constituent elements disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a memory core unit which includes a plurality of memory cells selected by an address signal;
    a clock synchronous circuit which receives an external clock signal and generates a plurality of internal clock signals;
    a control circuit which receives an external control signal in synchronism with the internal clock signal generated by the clock synchronous circuit and generates the address signal and internal control signals;
    a data multiplexer which includes a plurality of input parallel data lines and a plurality of output parallel data lines and is switched to one of a first output state and a second output state in accordance with the internal control signal output from the control circuit, the data multiplexer outputting parallel data, which is input to said plurality of input parallel data lines and read out from the memory core unit, to said plurality of output parallel data lines corresponding to said plurality of input parallel data lines in the first output state and selecting 1 bit data of the parallel data input to said plurality of input parallel data lines and outputting the 1 bit data to said plurality of output parallel data lines in the second output state;
    a conversion circuit which converts the parallel data output from the data multiplexer into serial data; and
    an output drive circuit which outputs the serial data converted by the conversion circuit to an external data signal line
    wherein
    the internal control signal includes a first internal control signal and a second internal control signal, and
    the data multiplexer comprises:
    a first transistor circuit which receives even numbered data of the parallel data read out from the memory core unit, outputs the even numbered data when the first internal control signal has a first voltage, and disconnects the even numbered data when the first internal control signal has a second voltage;
    a second transistor circuit which receives the even numbered data, outputs the even numbered data when the second internal control signal has the second voltage, and disconnects the even numbered data when the second internal control signal has the first voltage;
    a third transistor circuit which receives odd numbered data of the parallel data read out from the memory core unit, outputs the odd numbered data when the first internal control signal has the second voltage, and disconnects the odd numbered data when the first internal control signal has the first voltage; and
    a fourth transistor circuit which receives the odd numbered data, outputs the odd numbered data when the second internal control signal has the first voltage, and disconnects the odd numbered data when the second internal control signal has the second voltage.

2. The semiconductor memory device according to claim 1, wherein each of the first transistor circuit, the second transistor circuit, the third transistor circuit, and the fourth transistor circuit includes a PMOS transistor and an NMOS transistor, each of the PMOS transistor and the NMOS transistor including a gate to which one of the internal control signal and an inverted signal of the internal control signal is input.

3. The semiconductor memory device according to claim 1, wherein the data multiplexer is switched to the first output state when the internal control signal indicates a normal operation mode and to the second output state when the internal control signal indicates a test mode.

4. The semiconductor memory device according to claim 1, wherein the conversion circuit comprises:
    a shift register which converts the n bit (n is a natural number: n≧2) parallel data output from the data multiplexer into a plurality of m bit (m is a natural number: m<n) serial data; and
    an output buffer circuit which converts said plurality of n bit serial data converted by the shift register into a bit serial data.

5. The semiconductor memory device according to claim 1, wherein the memory core unit includes a NAND memory cell structure.

6. The semiconductor memory device according to claim 5, wherein the NAND memory cell structure includes a memory cell group, a first select gate transistor connected to one terminal of the memory cell group, and a second select gate transistor connected to the other terminal of the memory cell group, the memory cell group comprising a plurality of memory cells including a control gate and a floating gate and connected in series so that adjacent memory cells share one of a source and a drain.

7. A semiconductor memory device comprising:
    a memory core unit which includes a plurality of memory cells selected by an address signal;
    a clock synchronous circuit which receives an external clock signal and generates a plurality of internal clock signals;
    a control circuit which receives an external control signal in synchronism with the internal clock signal generated by the clock synchronous circuit and generates the address signal and internal control signals;
    a shift register which converts n bit (n is a natural number: n≧2) parallel data read out from the memory core unit into a plurality of m bit (m is a natural number: m<n) serial data in synchronism with the internal clock signal generated by the clock synchronous circuit;
    a data multiplexer which includes a plurality of input parallel data lines and a plurality of output parallel data lines and is switched to one of a first output state and a second output state in accordance with the internal control signal output from the control circuit, the data multiplexer outputting said plurality of m bit serial data input to said plurality of input parallel data lines to said plurality of output parallel data lines corresponding to said plurality of input parallel data lines in the first output state and selecting 1 bit data of said plurality of m bit serial data input to said plurality of input parallel data lines and outputting the 1 bit data to said plurality of output parallel data lines in the second output state;
    an output buffer circuit which converts the parallel data output from the data multiplexer into serial data; and
    an output drive circuit which outputs the serial data converted by the output buffer circuit to an external data signal line wherein the internal control signal includes a first internal control signal and a second internal control signal, and the data multiplexer comprises:

a first transistor circuit which receives even numbered data of the parallel data output from the shift register, outputs the even numbered data when the first internal control signal has a first voltage, and disconnects the even numbered data when the first internal control signal has a second voltage;

a second transistor circuit which receives the even numbered data, outputs the even numbered data when the second internal control signal has the second voltage, and disconnects the even numbered data when the second internal control signal has the first voltage;

a third transistor circuit which receives odd numbered data of the parallel data output from the shift register, outputs the odd numbered data when the first internal control signal has the second voltage, and disconnects the odd numbered data when the first internal control signal has the first voltage; and a fourth transistor circuit which receives the odd numbered data, outputs the odd numbered data when the second internal control signal has the first voltage, and disconnects the odd numbered data when the second internal control signal has the second voltage.

8. The semiconductor memory device according to claim 7, wherein each of the first transistor circuit, the second transistor circuit, the third transistor circuit, and the fourth transistor circuit includes a PMOS transistor and an NMOS transistor, each of the PMOS transistor and the NMOS transistor including a gate to which one of the internal control signal and an inverted signal of the internal control signal is input.

9. The semiconductor memory device according to claim 7, wherein the data multiplexer is switched to the first output state when the internal control signal indicates a normal operation mode and to the second output state when the internal control signal indicates a test mode.

10. The semiconductor memory device according to claim 7, wherein the memory core unit includes a NAND memory cell structure.

11. The semiconductor memory device according to claim 10, wherein the NAND memory cell structure includes a memory cell group, a first select gate transistor connected to one terminal of the memory cell group, and a second select gate transistor connected to the other terminal of the memory cell group, the memory cell group comprising a plurality of memory cells including a control gate and a floating gate and connected in series so that adjacent memory cells share one of a source and a drain.

* * * * *